(12) United States Patent
Tian et al.

(10) Patent No.: US 11,782,769 B2
(45) Date of Patent: Oct. 10, 2023

(54) VIRTUAL MACHINE SCHEDULING METHOD AND SYSTEM

(71) Applicant: Alibaba Group Holding Limited, Grand Cayman (KY)

(72) Inventors: Zhengxiong Tian, Hangzhou (CN); Haihong Xu, Hangzhou (CN); Linquan Jiang, Hangzhou (CN); Jun Song, Hangzhou (CN); Bo Zhu, Beijing (CN); Junjie Cai, Sunnyvale, CA (US)

(73) Assignee: Alibaba Group Holding Limited

( * ) Notice: Subject to any disclaimer, the term of this patent is extended or adjusted under 35 U.S.C. 154(b) by 452 days.

(21) Appl. No.: 17/066,362

(22) Filed: Oct. 8, 2020

(65) Prior Publication Data

US 2021/0034436 A1 Feb. 4, 2021

Related U.S. Application Data

(63) Continuation of application No. PCT/CN2019/080946, filed on Apr. 2, 2019.

(30) Foreign Application Priority Data

Apr. 9, 2018 (CN) .......................... 201810312065.8

(51) Int. Cl.
*G06F 9/50* (2006.01)
*G06N 20/00* (2019.01)
(Continued)

(52) U.S. Cl.
CPC ........ *G06F 9/5088* (2013.01); *G06F 9/45558* (2013.01); *G06F 9/4893* (2013.01);
(Continued)

(58) Field of Classification Search
CPC .. G06F 9/5088; G06F 9/45558; G06F 9/4893; G06F 9/5094; G06F 18/214;
(Continued)

(56) References Cited

U.S. PATENT DOCUMENTS 8,291,413 B2 10/2012 Mizuno
8,359,594 B1 1/2013 Davidson et al.
(Continued)

FOREIGN PATENT DOCUMENTS

CN 104360893 A 2/2015
CN 105426229 A 3/2016
(Continued)

OTHER PUBLICATIONS

Extended European Search Report dated Dec. 7, 2021 for European Patent Application No. 19785670.1, 8 pages.
(Continued)

*Primary Examiner* — Kenneth Tang
(74) *Attorney, Agent, or Firm* — Lee & Hayes, P.C.

(57) ABSTRACT

A method and a system for scheduling a virtual machine are disclosed. The method includes: obtaining energy consumption data of a rack and energy consumption data of host computers, wherein the rack is used to place the host computers; determining power consumption data of a virtual machine; determining a target host computer corresponding to the virtual machine according to the energy consumption data of the rack, the energy consumption data of the host computers, and the power consumption data of the virtual machine; and dispatching the virtual machine to the target host computer. The present disclosure solves the technical problems of unbalanced power consumption scheduling caused by virtual machine scheduling methods that are implemented only according to CPU parameters in the existing technologies.

17 Claims, 9 Drawing Sheets

(51) Int. Cl.
  *G06F 9/455* (2018.01)
  *G06F 9/48* (2006.01)
  *H05K 7/14* (2006.01)
  *G06F 18/214* (2023.01)

(52) U.S. Cl.
  CPC .......... *G06F 9/5094* (2013.01); *G06F 18/214* (2023.01); *G06N 20/00* (2019.01); *H05K 7/1492* (2013.01); *G06F 2009/4557* (2013.01); *G06F 2009/45562* (2013.01)

(58) Field of Classification Search
  CPC ... G06F 2009/45562; G06F 2009/4557; G06F 9/5072; G06F 9/5077; G06F 1/26; G06F 1/32; G06F 1/3203; G06N 20/00; H05K 7/1492; Y02D 10/00
  See application file for complete search history.

(56) References Cited

U.S. PATENT DOCUMENTS

| | | | |
|---|---|---|---|
| 8,448,006 | B2 | 5/2013 | Floyd et al. |
| 8,589,932 | B2 | 11/2013 | Bower, III et al. |
| 8,862,914 | B2 | 10/2014 | Kansal et al. |
| 9,043,172 | B2 | 5/2015 | Chen et al. |
| 9,250,962 | B2 | 2/2016 | Brech et al. |
| 9,367,340 | B2 | 6/2016 | Wang |
| 10,162,658 | B2 | 12/2018 | Nicholas et al. |
| 10,386,900 | B2 | 8/2019 | Hannon et al. |
| 2011/0239010 | A1 | 9/2011 | Jain et al. |
| 2014/0208322 | A1 | 7/2014 | Sasaki et al. |
| 2014/0351613 | A1* | 11/2014 | Kansal ............... G06F 1/3203 713/320 |
| 2015/0227397 | A1* | 8/2015 | Gogula ............... G06F 9/5094 718/104 |
| 2015/0317179 | A1 | 11/2015 | Fahrig |
| 2017/0220092 | A1 | 8/2017 | Kodama |
| 2018/0225149 | A1* | 8/2018 | Bianchini ............. G06F 9/5016 |

FOREIGN PATENT DOCUMENTS

| | | |
|---|---|---|
| CN | 105893113 A | 8/2016 |
| CN | 105955795 A | 9/2016 |
| CN | 107193640 A | 9/2017 |
| CN | 107479949 A | 12/2017 |
| JP | 2013092951 A | 5/2013 |
| JP | 2013524317 A | 6/2013 |
| JP | 2013152552 A | 8/2013 |
| JP | 2013201634 A | 10/2013 |
| JP | 2017134668 A | 8/2017 |
| WO | WO2011119444 A2 | 9/2011 |

OTHER PUBLICATIONS

Translation of Chinese Office Action from corresponding CN Application No. 201810312065.8 dated Nov. 18, 2022, a counterpart foreign application for U.S. Appl. No. 17/066,362, 10 pages.
Translation of Chinese Search Report from corresponding CN Application No. 201810312065.8 dated Nov. 9, 2022, a counterpart foreign application for U.S. Appl. No. 17/066,362, 2 pages.
Translation of International Search Report from corresponding PCT Application No. PCT/CN2019/080946 dated Jul. 5, 2019, a counterpart foreign application for U.S. Appl. No. 17/066,362, 2 pages.
Translation of Written Opinion from corresponding PCT Application No. PCT/CN2019/080946 dated Jul. 5, 2019, a counterpart foreign application for U.S. Appl. No. 17/066,362, 4 pages.
Japanese Office Action dated Jun. 5, 2023 for Japanese Patent Application No. 2020-555379, a foreign counterpart to U.S. Appl. No. 17/066,362, 11 pages.

* cited by examiner

FIG. 4

|   | NEWTIME | PROCESSOR | DEV | COR | THR | CFREQ | X.UTIL | X.C0 | DTS | TEMP | VOLT |
|---|---------|-----------|-----|-----|-----|-------|--------|------|-----|------|------|
| 2 | 083537 | 0 | CPU0 | 0 | 0 | 2793 | 10... | 100.00 | 45 | 54 | 0.8... |
| 4 | 083537 | 1 | CPU0 | 1 | 0 | 2786 | 0.0 | 0.03 | 52 | 47 | 0.8... |
| 6 | 083537 | 2 | CPU0 | 2 | 0 | 2795 | 0.0 | 0.05 | 53 | 46 | 0.8... |
| 8 | 083537 | 3 | CPU0 | 3 | 0 | 2794 | 0.2 | 0.16 | 55 | 44 | 0.8... |
| 10 | 083537 | 4 | CPU0 | 4 | 0 | 2796 | 0.0 | 0.05 | 55 | 44 | 0.8... |
| 12 | 083537 | 5 | CPU0 | 5 | 0 | 2798 | 0.0 | 0.03 | 54 | 45 | 0.8... |
| 14 | 083537 | 6 | CPU0 | 6 | 0 | 2796 | 0.1 | 0.09 | 54 | 45 | 0.8... |
| 16 | 083537 | 7 | CPU0 | 7 | 0 | 2795 | 0.1 | 0.14 | 55 | 44 | 0.8... |
| 18 | 083537 | 8 | CPU0 | 8 | 0 | 2793 | 0.1 | 0.08 | 53 | 46 | 0.8... |
| 20 | 083537 | 9 | CPU0 | 9 | 0 | 2794 | 0.1 | 0.11 | 54 | 45 | 0.8... |
| 22 | 083537 | 10 | CPU0 | 10 | 0 | 2793 | 0.1 | 0.14 | 53 | 46 | 0.8... |
| 24 | 083537 | 11 | CPU0 | 11 | 0 | 2790 | 0.0 | 0.05 | 53 | 46 | 0.8... |
| 26 | 083537 | 12 | CPU0 | 12 | 0 | 2795 | 0.0 | 0.02 | 55 | 44 | 0.8... |
| 28 | 083537 | 13 | CPU0 | 13 | 0 | 2794 | 0.1 | 0.12 | 52 | 47 | 0.8... |
| 30 | 083537 | 14 | CPU0 | 14 | 0 | 2793 | 0.2 | 0.24 | 53 | 46 | 0.8... |
| 32 | 083537 | 15 | CPU0 | 15 | 0 | 2793 | 0.0 | 0.03 | 53 | 46 | 0.8... |
| 34 | 083537 | 16 | CPU0 | 16 | 0 | 2789 | 0.0 | 0.03 | 54 | 45 | 0.8... |
| 36 | 083537 | 17 | CPU0 | 17 | 0 | 2793 | 0.2 | 0.18 | 55 | 44 | 0.8... |
| 38 | 083537 | 18 | CPU0 | 18 | 0 | 2787 | 0.0 | 0.03 | 54 | 45 | 0.8... |
| 40 | 083537 | 19 | CPU0 | 19 | 0 | 2794 | 0.0 | 0.02 | 55 | 44 | 0.8... |
| 42 | 083537 | 20 | CPU0 | 20 | 0 | 2784 | 0.0 | 0.02 | 52 | 47 | 0.8... |

|   | NEWTIME | DEV | CFREQ | X.UTIL | X.C0 | DTS | TEMP | VOLT |
|---|---------|-----|-------|--------|------|-----|------|------|
| 1 | 083537 | CPU0 | 145144 | 157.2 | 158.02 | 2778 | 2370 | 44.946 |
| 2 | 083537 | CPU01 | 145198 | 21.8 | 22.06 | 2676 | 2472 | 45.768 |

VIRTUAL MACHINE SCHEDULING METHOD AND SYSTEM

CROSS REFERENCE TO RELATED PATENT APPLICATIONS

This application claims priority to and is a continuation of PCT Patent Application No. PCT/CN2019/080946 filed on 2 Apr. 2019, and is related to and claims priority to Chinese Application No. 201810312065.8, filed on 9 Apr. 2018 and entitled "Virtual Machine Scheduling Method and System," which are hereby incorporated by reference in their entirety.

TECHNICAL FIELD

The present disclosure relates to the field of cloud computing, and particularly to virtual machine scheduling methods and systems.

BACKGROUND

At present, cloud computing scheduling in the industry generally uses static factors such as CPU, memory, etc., and dynamic factors such as CPU utilization rates, network utilization rates, etc. to jointly restrict whether a virtual machine can be scheduled on a host computer, i.e., existing methods of scheduling a virtual machine is implemented based on CPU parameters only. Also, power consumption for a host computer is not evenly distributed.

In terms of power consumption, purposes of saving power reducing power consumption of a machine are generally achieved by adjusting parameters of a server (including shutdown, hibernation). Existing power consumption scheduling is based on power-saving scheduling, and attempts to increase the number of dormant servers. However, the primary cost of a data center is the cost of computer rooms and devices. In order to fully share the cost, more servers need to be racked and more virtual machines need to be sold. In the current industry, the density of a rack is adjusted based on experience values, and it is necessary to reserve a space to prevent the entire rack from powering down and causing a waste.

In view of the problems of unbalanced power consumption scheduling caused by virtual machine scheduling methods that are implemented only according to CPU parameters in existing technologies, no effective solution has currently been proposed yet.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter. The term "techniques," for instance, may refer to device(s), system(s), method(s) and/or processor-readable/computer-readable instructions as permitted by the context above and throughout the present disclosure.

Embodiments of the present disclosure provide a method and a system for scheduling a virtual machine to at least solve the technical problems of unbalanced power consumption scheduling caused by virtual machine scheduling methods that are implemented only according to CPU parameters in the existing technologies.

In implementations, a method for scheduling a virtual machine is provided, which includes: obtaining energy consumption data of a rack and energy consumption data of host computers, wherein the rack is used to place the host computers; determining power consumption data of a virtual machine; determining a target host computer corresponding to the virtual machine according to the energy consumption data of the rack, the energy consumption data of the host computers, and the power consumption data of the virtual machine; and dispatching the virtual machine to the target host computer.

In implementations, a method for scheduling a virtual machine is also provided, which includes: obtaining energy consumption data of a rack, energy consumption data of host computers and power consumption data of a virtual machine, wherein multiple host computers are placed in the rack; determining a target host computer corresponding to the virtual machine based on the energy consumption data of the rack, the energy consumption data of the host computers and the power consumption data of the virtual machine; dispatching the virtual machine to the host computer; and obtaining a shelf density of the rack based on the energy consumption data of the rack and the energy consumption data of the host computers, wherein the shelf density is used to characterize a number of host computers placed on the same rack.

In implementations, a storage medium is also provided. The storage medium includes a stored program. When running, the program controls a device where the storage medium is located to perform the following steps: obtaining energy consumption data of a rack and energy consumption data of host computers, wherein the rack is used to place the host computers; determining power consumption data of a virtual machine; determining a target host computer corresponding to the virtual machine according to the energy consumption data of the rack, the energy consumption data of the host computers, and the power consumption data of the virtual machine; and dispatching the virtual machine to the target host computer.

In implementations, a processor is also provided, the processor is used to run a program, wherein the program executes the following steps when the program is running: obtaining energy consumption data of a rack and energy consumption data of host computers, wherein the rack is used to place the host computers; determining power consumption data of a virtual machine; determining a target host computer corresponding to the virtual machine according to the energy consumption data of the rack, the energy consumption data of the host computers, and the power consumption data of the virtual machine; and dispatching the virtual machine to the target host computer.

In implementations, a virtual machine scheduling system is also provided, which includes: a processor; and a memory, coupled to the processor, and configured to provide the processor with instructions for processing the following processing steps: obtaining energy consumption data of a rack and energy consumption data of host computers, wherein the rack is used to place the host computers; determining power consumption data of a virtual machine; determining a target host computer corresponding to the virtual machine according to the energy consumption data of the rack, the energy consumption data of the host computers, and the power consumption data of the virtual machine; and dispatching the virtual machine to the target host computer.

In the embodiments of the present disclosure, energy consumption data of a rack and host computers can be obtained, and power consumption data of a virtual machine can be determined at the same time. A target host computer can be determined based on the energy consumption data of the rack and the host computers and the power consumption data of the virtual machine. The virtual machine can be dispatched to the target host computer. As such, a purpose of scheduling virtual machines based on real-time perception of power consumption is achieved.

It is easy to notice that, since a target host computer corresponding to a virtual machine is determined according to energy consumption data of a rack, energy consumption data of host computers, and power consumption data of the virtual machine, not only CPU parameters are considered, but also the power consumption of the rack and the host computers are considered when virtual machine scheduling is performed, as compared with the existing technologies. Balancing of power consumption scheduling of host computers at a granularity of a rack of a data center is achieved, and the technical effects of improving a resource utilization rate of the cloud computing data center are achieved.

Therefore, the solutions provided by the present disclosure solve the technical problems of unbalanced power consumption scheduling caused by virtual machine scheduling methods that are implemented merely according to CPU parameters in the existing technologies.

BRIEF DESCRIPTION OF THE DRAWINGS

The accompanying drawings described herein are used to provide a further understanding of the present disclosure, and constitute a part of the present disclosure. Exemplary embodiments of the present disclosure and descriptions thereof are used to explain the present disclosure, and do not constitute improper limitations of the present disclosure. In the accompanying drawings:

FIG. 4 is a schematic diagram of a correlation matrix of a virtual machine power consumption model according to the embodiments of the present disclosure.

DETAILED DESCRIPTION

In order to enable one skilled in the art to better understand the solutions of the present disclosure, the technical solutions in the embodiments of the present disclosure will be described clearly and completely with reference to the accompanying drawings in the embodiments of the present disclosure. Apparently, the described embodiments represent merely a part and not all of the embodiments of the present disclosure. Based on the embodiments of the present disclosure, all other embodiments obtained by one of ordinary skill in the art without making any creative effort shall fall within the scope of protection of the present disclosure.

It should be noted that terms "first" and "second", etc., in the description of the present disclosure and the aforementioned drawings are used to distinguish similar objects, and not necessarily used to describe a specific order or sequence. It should be understood that data used in this way can be interchanged under appropriate situations, so that the embodiments of the present disclosure described herein can be implemented in an order other than those illustrated or described herein. In addition, terms "containing", "having", and any variations thereof are intended to cover non-exclusive inclusions. For example, a process, method, system, product or device that includes a series of steps or units is not necessarily limited to those explicitly listed steps or units, and may include other steps or units that are not explicitly listed or that are inherent to such process, method, system, product or device.

First of all, some nouns or terms that appear in a process of describing the embodiments of the present disclosure are suitable for the following interpretations:

Virtual machine (VM) scheduling: When creating a virtual machine, this can be a process of how a scheduling system allocates the virtual machine to a specific host computer (NC).

Rack (RACK): This can be a shelf where a host computer (NC) is placed in a computer room, having a limit for rated power consumption.

Shelf density: This can be the number of host computers (NC) placed under a same rack.

Thermal design power (TDP): This can be the power consumption of a processor under the worst or worst case. A design of a thermal solution needs to meet this thermal design power.

Power Capping: This is a power limit of a host computer (NC), which can be the maximum or minimum power consumption of a processor.

According to the embodiments of the present disclosure, a method for scheduling a virtual machine is also provided. It needs to be noted that steps shown in a flowchart of the accompanying drawings can be executed in a computer system such as a set of computer executable instructions. Also, although a logical order is shown in the flowchart, in some cases, the steps may be performed in an order different from the one shown or described herein.

Figure 1:
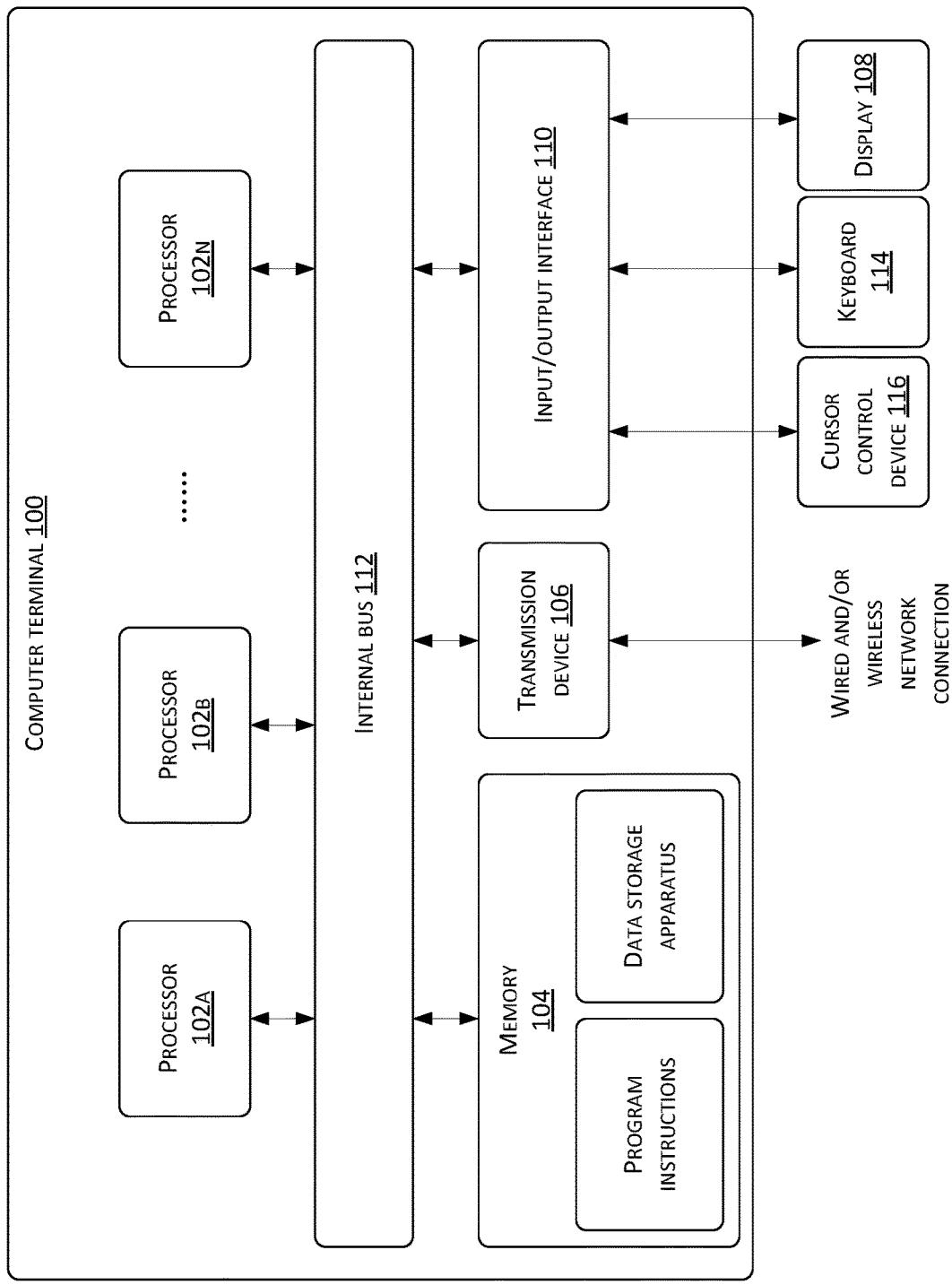
FIG. 1 is a hardware structure block diagram of a computer terminal (or a mobile device) for implementing a virtual machine scheduling method according to the embodiments of the present disclosure.

The method provided in the embodiments of the present disclosure may be executed in a mobile terminal, a computer terminal or a similar computing device. FIG. 1 shows a block diagram of the hardware structure of a computer terminal (or a mobile device) used to implement a virtual machine scheduling method. As shown in FIG. 1, a computer terminal 100 (or a mobile device 10) may include one or more (shown as 102a, 102b, . . . , 102n in the figure) processors 102 (the processor 102 may include, but is not limited to, a processing device such as a micro-processor MCU or a programmable logic device FPGA), a memory 104 used for storing data, and a transmission device 106 used for communication functions. In addition, a display 108, an input/output interface (I/O interface) 110, an internal bus 112, a keyboard 114, a cursor control device 116, etc. In implementations, the computer terminal 100 may further include a universal serial bus (USB) port (which may be included as one of the ports of I/O interface), a network interface, a power supply and/or a camera (which are not shown in the figure). One of ordinary skill in the art can understand that the structure shown in FIG. 1 is intended for illustration only, and is not construed as a limitation to the structure of the above electronic device. For example, the computer terminal 100 may also include more or fewer components than those shown in FIG. 1, or have a configuration different from that shown in FIG. 1.

It needs to be noted that the one or more processors 102 and/or other data processing circuits may generally be referred to as "data processing circuits" herein. The data processing circuit can be embodied in whole or in part as software, hardware, firmware or any other combination. In addition, the data processing circuit may be a single independent processing module, or fully or partially integrated into any one of other components in the computer terminal 100 (or the mobile device). As mentioned in the embodiments of the present disclosure, the data processing circuit is used as a type of processor control (for example, a selection of a variable resistance terminal path that is connected to an interface).

The memory 104 may be configured to store software programs and modules of application software, such as program instructions/data storage devices corresponding to the virtual machine scheduling method in the embodiments of the present disclosure. The processor(s) 102 execute(s) various functional applications and data processing by software program(s) and module(s) stored in the memory 104, i.e., implementing the virtual machine scheduling method. The memory 104 may include a high-speed random access memory, and may also include a non-volatile memory, such as one or more magnetic storage devices, flash memory, or other non-volatile solid-state memory. In some examples, the memory 104 may further include storage devices that are remotely deployed with respect to processor(s) 102, and these storage devices may be connected to the computer terminal 100 via a network. Examples of the network include, but are not limited to, the Internet, a corporate intranet, a local area network, a mobile communication network, and a combination thereof.

The transmission device 106 is configured to receive or send data via a network. Specific examples of the network may include a wireless network provided by a communication provider of the computer terminal 100. In an example, the transmission device 106 includes a network adapter (Network Interface Controller, NIC), which can be connected to other network devices through a base station to communicate with the Internet. In an example, the transmission device 106 may be a radio frequency (RF) module, which is used to communicate with the Internet wirelessly.

The display 108 may be, for example, a touch screen liquid crystal display (LCD), which may enable a user to interact with a user interface of the computer terminal 100 (or the mobile device).

It should be noted here that, in implementations, the computer device (or the mobile device) as shown in FIG. 1 may include hardware elements (including circuits) and software elements (including computer codes stored on a computer-readable medium), or a combination of hardware and software components. It should be noted that FIG. 1 is only an example of specific embodiments, and is intended to show types of components that may be present in the computer device (or mobile device) as described above.

Figure 2:
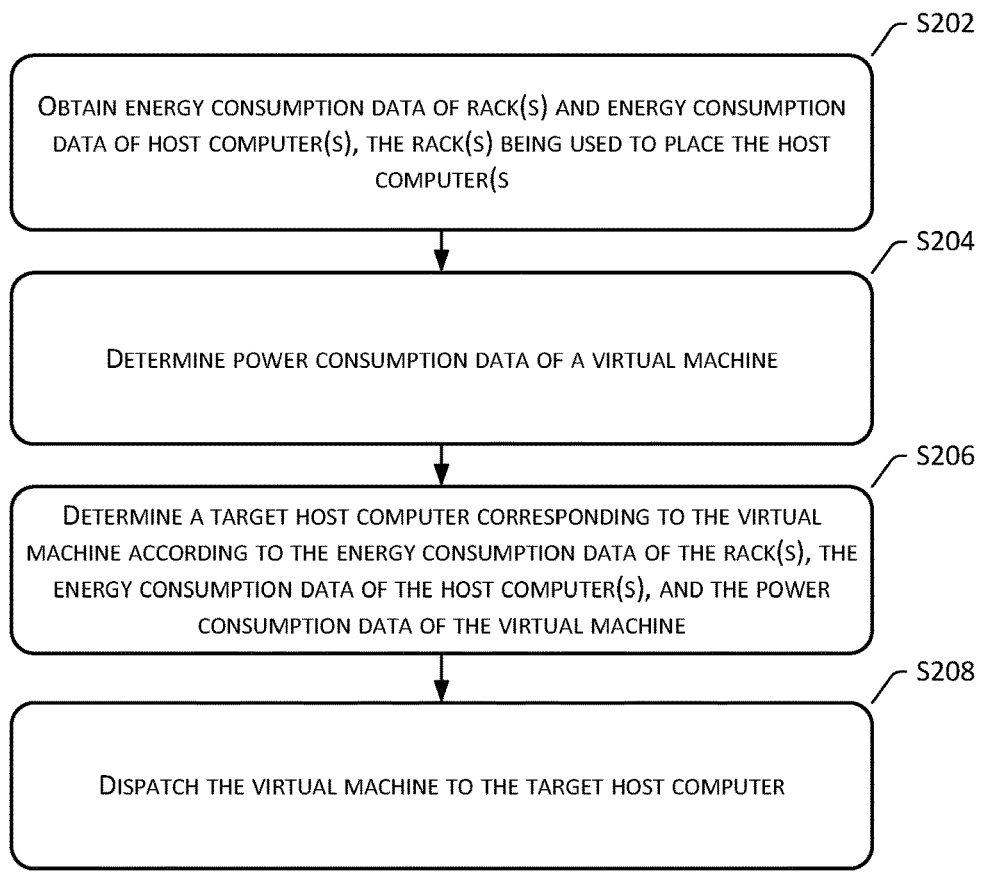
FIG. 2 is a flowchart of a method for scheduling a virtual machine according to the embodiments of the present disclosure.

In the above operating environment, the present disclosure provides a flowchart of a virtual machine scheduling method as shown in FIG. 2. FIG. 2 is a flowchart of a method 200 for scheduling a virtual machine according to the embodiments of the present disclosure.

Step S202: Obtain energy consumption data of rack(s) and energy consumption data of host computer(s), the rack(s) being used to place the host computer(s).

It should be noted that the virtual machine scheduling method provided in the present disclosure is applied to a cloud computing data center.

In implementations, the energy consumption data includes: power consumption data and electric heating data.

Specifically, a host computer (NC) as described above may be a server placed on a rack. The energy consumption data may be real-time power consumption data and electric heating data of the rack(s) or the NC(s). The electric heating data mainly refers to respective temperature(s) of the rack(s) or the NC(s). Both the power consumption data and the electric heating data include an inventory level and an early warning level, wherein the early warning level can be a minimum inventory level that is configured in advance according to actual usage requirements.

Step S204: Determine power consumption data of a virtual machine.

Specifically, a virtual machine as described above may be a newly created virtual machine (VM), or a VM that needs to be scheduled or migrated for a second time, which includes a server VM and a user VM. In order to ensure a balanced distribution of power consumption of virtual machines, it is necessary to determine power consumption data of virtual machine(s), i.e., determining power consumption data of a server VM and a user VM. Different VM types have different corresponding power consumption models. For example, a power consumption model corresponding to a server VM may be a correlation model, and a power consumption model corresponding to a user VM may be a user behavior model.

Step S206: Determine a target host computer corresponding to the virtual machine according to the energy consumption data of the rack(s), the energy consumption data of the host computer(s), and the power consumption data of the virtual machine.

In order to ensure balanced scheduling of power consumption of virtual machines, a scheduling system can perform power-aware scheduling based on power consumption data, inventory level, etc., i.e., combining energy consumption data of racks and NCs, and power consumption data of VMs to perform balanced scheduling of VMs, in order to minimize a variance of power consumptions between racks, to ensure that high-power VMs are preferentially scheduled to NCs with sufficient power consumption. In other words, respective power consumptions of the racks and CPUs of the host computers are made to be as even as possible.

Step S208: Dispatch the virtual machine to the target host computer.

In implementations, when a VM needs to be dispatched, the power consumption data and the electric heating data of the rack(s) and the NC(s) placed on the rack(s) can be collected in real time, and the power consumption data and future power consumption data of the VM can be predicted at the same time. According to the power consumption data and the electric heating data of the rack(s) and the NC(s), and the power consumption data and the future power consumption data of the virtual machine, a determination is made that the VM needs to be dispatched to a corresponding rack and a corresponding NC (i.e., determining a NC corresponding to the VM), and the virtual machine is then dispatched to that NC.

Figure 3:
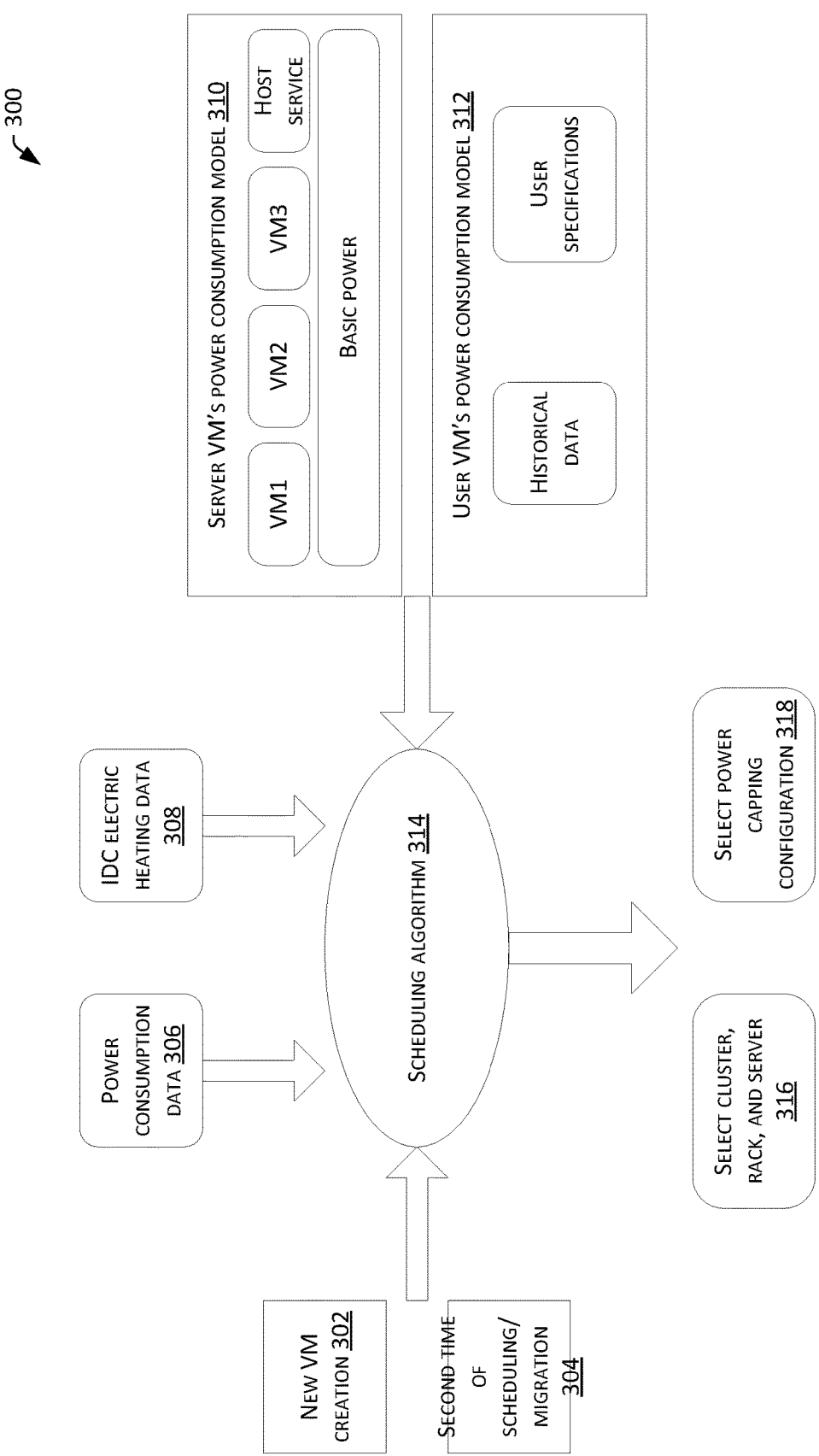
FIG. 3 is a schematic diagram of a virtual machine scheduling method according to the embodiments of the present disclosure.

For example, as shown in FIG. 3, when a VM is newly created 302, or a second time of scheduling/migration 304 is made, power consumption data 306 of racks and NCs and electric heating data 308 of an IDC (Internet Data Center, short for Internet Data Center) can be collected. Power consumption data of the VM is obtained using power consumption model(s) 310 of server VM(s) and power consumption model(s) 312 of user VM(s). The power consumption data 306 of the racks and the NCs, the electric heating data 308 of the IDC and the power consumption data of the VM is inputted into the scheduling system. Using a scheduling algorithm 314, scheduling of the VM is performed to select 316 a cluster, a rack and a server.

The solutions provided in the embodiments of the present disclosure can obtain energy consumption data of rack(s) and host computer(s), determine power consumption data of a virtual machine at the same time, determine a target host computer according to the energy consumption data of the rack(s) and the host computer(s) and the power consumption data of the virtual machine, and dispatch the virtual machine to the target host computer, thereby achieving the purpose of dispatching virtual machines based on real-time perception of power consumption.

It is easy to notice that, since a target host computer corresponding to a virtual machine is determined according to energy consumption data of a rack, energy consumption data of host computers, and power consumption data of the virtual machine, not only CPU parameters are considered, but also the power consumption of the rack and the host computers are considered when virtual machine scheduling is performed, as compared with the existing technologies. Balancing of power consumption scheduling of host computers at a granularity of a rack of a data center is achieved, and the technical effects of improving a resource utilization rate of the cloud computing data center are achieved.

Therefore, the solutions of the foregoing embodiments provided by the present disclosure solve the technical problems of unbalanced power consumption scheduling caused by virtual machine scheduling methods that are implemented merely according to CPU parameters in the existing technologies.

In implementations, determining the target host computer corresponding to the virtual machine according to the energy consumption data of the rack(s), the energy consumption data of the host computer(s), and the power consumption data of the virtual machine at step S206, includes:

Step S206-2: Determine first rack(s) having normal energy consumption according to the energy consumption data of the rack(s).

In implementations, the first rack is a rack whose power consumption data does not exceed a first threshold, and whose electric heating data does not exceed a second threshold.

In order to avoid a rack from having an excessive power consumption or a high temperature, and to avoid the power consumption from continuing to increase after a VM is dispatched, filtering of racks can be performed to eliminate racks having a high power consumption and a high temperature before scheduling the VM. In other words, racks with normal energy consumption are determined from all the racks, and racks with abnormal energy consumption are eliminated.

In implementations, the first threshold may be the maximum power consumption for determining that a power consumption of a rack is normal. If power consumption data of a rack exceeds the first threshold, a determination is made that power consumption of the rack is too high, and the rack is a rack with abnormal energy consumption. The second threshold may be the highest temperature for determining that the temperature of a rack is normal. If electric heating data of a rack exceeds the second threshold, a determination is made that the temperature of the rack is too high, and the rack is a rack with abnormal energy consumption.

Step S206-4: Determine first host computer(s) with a normal energy consumption according to energy consumption data of host computer(s) placed on the first rack(s).

In implementations, the first host computer is placed on the first rack, and having power consumption data that does not exceed a third threshold, electric heating data that does not exceed a fourth threshold, and a hardware detection result indicating a host computer to have no abnormality.

Similar to the principles of rack filtering, before scheduling a VM, NCs can be filtered to eliminate NCs with high power consumption, high temperature, and abnormal hardware (such as abnormal fans), i.e., determining NCs with normal energy consumption and eliminating NCs with abnormal energy consumption from among all the NCs that are placed on racks with normal energy consumption.

In implementations, the third threshold may be the maximum power consumption for determining that a power consumption of a NC is normal. If power consumption data of a NC exceeds the third threshold, a determination is made that the power consumption of the NC is too high, and the NC is an NC with abnormal energy consumption. The fourth threshold may be the highest temperature for determining that the temperature of a NC is normal. If electric heating data of a NC exceeds the fourth threshold, a determination is made that the temperature of the NC is too high, and the NC is an NC with abnormal energy consumption. The hardware detection result may be a result obtained by an abnormal detection mechanism that automatically performs detection on hardware components of a NC and puts a mark on the NC.

It should be noted that no VM is not allowed to be dispatched to any NC on a rack with abnormal energy consumption, and no VM is not allowed to be dispatched to an NC with abnormal energy consumption. In other words, all NCs on racks with abnormal energy consumption and NCs with abnormal energy consumption are not allowed to perform VM scheduling.

Step S206-6: Determine a target host computer according to the energy consumption data of the first host computer(s) and power consumption data of a virtual machine.

In implementations, after filtering abnormal racks and abnormal NCs, a target NC corresponding to a VM can be determined according to respective power consumptions of NCs and power consumption of the VM after filtering, so as to ensure preferentially dispatching a high-power VM to a NC having a sufficient power consumption level, i.e., high-power VMs corresponding to NCs having lower power consumption.

In implementations, determining the target host computer according to the energy consumption data of the first host computer(s) and the power consumption data of the virtual machine at step S206-6, includes:

Step S206-6-2: Determine weight value(s) of the first host computer(s) according to the power consumption data of the first host computer(s), wherein the power consumption data is inversely proportional to the weight value(s).

In implementations, in order to ensure that a VM with high power consumption is preferentially dispatched to a NC with a sufficient power consumption level, a corresponding weight value can be calculated according to power consumption of the NC. A weight value of a NC with high power consumption is small.

Step S206-6-4: Obtain the target host computer according to the weight value(s) of the first host computer(s) and the power consumption data of the virtual machine.

In implementations, the scheduling system can be divided into a filter and a weighting device. After racks and NCs with abnormal energy consumption are filtered by the filter, the weighting device can calculate each NC according to a corresponding weight value for remaining NCs, weight and score the remaining NCs according to the weight values of the NCs and the power consumption of the VM, and selects a NC with the highest ranking to obtain the target NC. For example, for NC1, a CPU utilization rate is 20%, and a power consumption utilization rate is 60%. A calculated weight ratio of a total load is that the CPU utilization rate and the power consumption utilization rate each account for 50%. A score of the NC1 is then: CPU Utilization score+ power utilization score=100*50%*20%+100*50%*60%= 10+30=40.

In implementations, before determining the target host computer corresponding to the virtual machine according to the energy consumption data of the rack(s), the energy consumption data of the host computer(s), and the power consumption data of the virtual machine at step S206, the method may further include the following steps:

Step S210: Determine whether the virtual machine is a preset virtual machine, wherein the preset virtual machine is a virtual machine that cannot be scheduled.

In implementations, the preset virtual machine may be a VM that cannot be actively migrated, which is set in advance according to security requirements, for example, a VM with a large memory, or a VM that cannot be hot-migrated.

Step S212: Determine the target host computer corresponding to the virtual machine according to the energy consumption data of the rack(s), the energy consumption data of the host computer(s), and the power consumption data of the virtual machine if the virtual machine is not a preset virtual machine.

In implementations, for VMs that can be actively migrated, racks can be filtered according to energy consumption data of the racks, and NCs can be further filtered according to energy consumption data of the NCs. According to energy consumption data of NCs remained after the filtering, corresponding weight values are calculated. Combining with the power consumption data of the VM, weighted scoring is performed for the NCs remained after the filtering, thereby selecting a NC with the highest ranking to obtain the target NC, and further dispatching the VM to the NC.

Step S214: Perform, if the virtual machine is a preset virtual machine, power-limiting processing on the preset virtual machine according to the power consumption data of the rack(s) and the host computer(s), and the power consumption data of the virtual machine.

In implementations, for VMs that cannot be actively migrated, power capping can be performed on the VMs that cannot be actively migrated based on energy consumption data of racks and NCs collected in real time and power consumption data of the VMs, to ensure the safety of rack levels. Specifically, according to real-time power consumption data and an early warning level, power capping can be performed on a VM that cannot be actively migrated, so as to ensure the safety of a rack level and achieve the purpose of scheduling with power capping that eliminates spikes in real time. For example, for a rack of 10000 W, the real-time power consumption reaches 90% (9000 W). A VM migration starts, and the real-time power consumption reaches 95% (9500). A NC can be selected for power capping.

For example, as shown in FIG. 3, during a process 300 of scheduling VMs by a scheduling algorithm, a scheduling system can select 314 a cluster, a rack and a server for a VM that can be actively migrated based on power consumption data 306 of racks and NCs, electric heating data 308 of an IDC, and power data consumption of the VM that is obtained. For a VM that cannot be actively migrated, a power capping configuration 318 can be selected based on power consumption data 306 of racks and NCs, electric heating data 308 of an IDC, and power consumption data of the VM that is obtained.

In implementations, determining the power consumption data of the virtual machine at step S204, includes:

Step S204-2: Obtain first power consumption data of the virtual machine through a correlation model, wherein the correlation model is used to characterize a correlation between feature parameters of the virtual machine.

Figure 4:
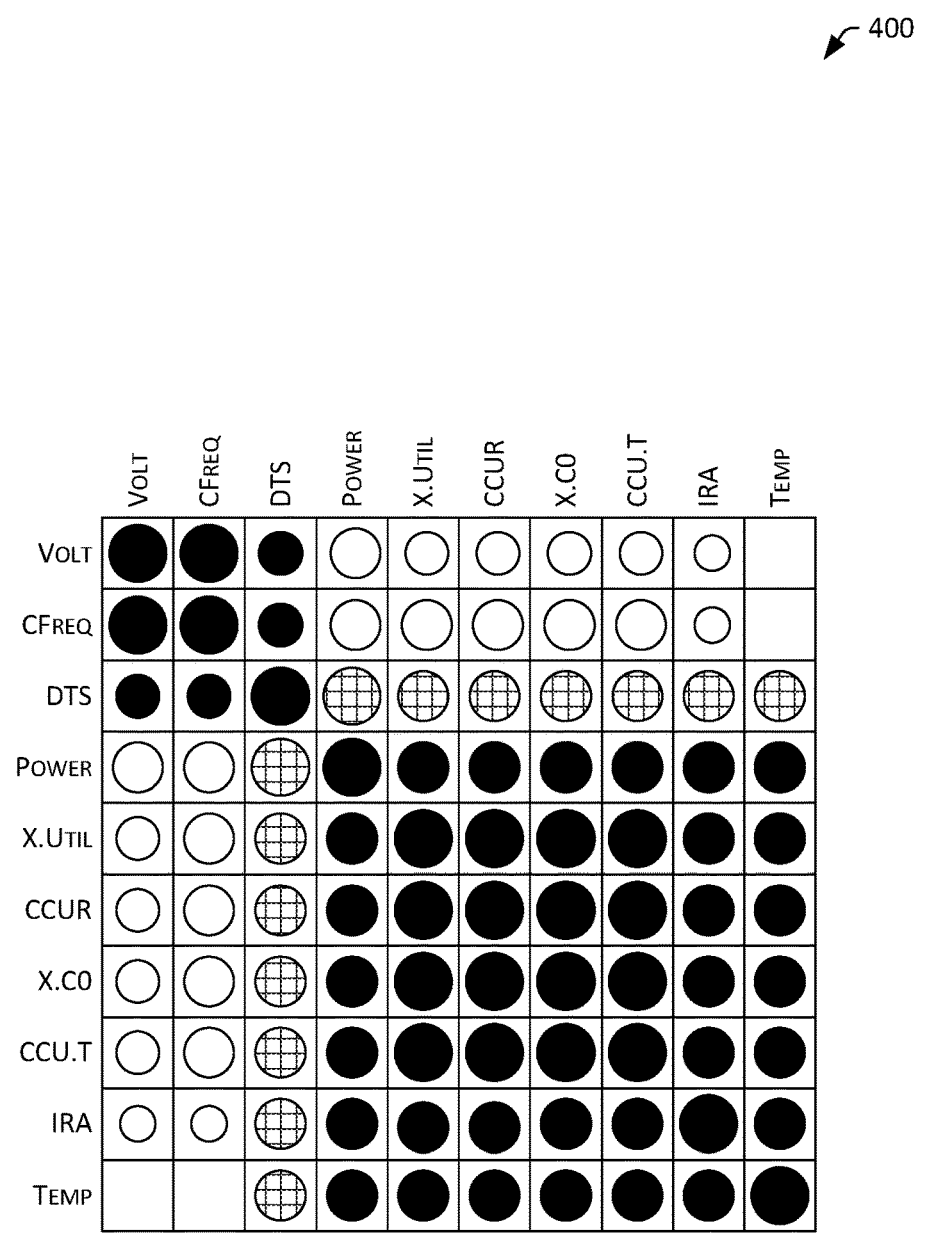
Figure 5:
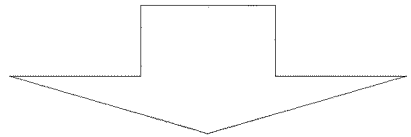
FIG. 5 is a schematic diagram of a feature vector of a virtual machine according to the embodiments of the present disclosure.

In implementations, for a server VM, power consumption data of the VM can be obtained through a correlation model, for example, a correlation matrix 400 shown in FIG. 4 (colors and sizes of circles in FIG. 4 are different, indicating that correlations thereof are different). A diagonal element of the matrix is an autocorrelation of a certain feature (such as Volt). An autocorrelation is 1, that is, values of diagonal elements of the matrix are all 1, and the matrix is a symmetric matrix. The feature parameters can be CFreq, Util, Temp, etc., as shown in FIG. 4 and FIG. 5. The feature parameters can include: Dev, CFreq, X.Util, X.C0, DTS, Temp, and Volt.

In implementations, as shown in FIG. 3, for a server VM, corresponding power consumption data can be obtained through a correlation model.

Step S204-4: Obtain second power consumption data of the virtual machine according to historical power consumption data and feature data of the virtual machine.

In implementations, the historical power consumption data may be user historical power consumption data of a user VM, and the feature data may be user features, for example, whether it is a big data user or an offline computing user.

In implementations, for a user VM, as shown in FIG. 3, historical data (i.e., historical power consumption data) and user specifications (i.e., feature data) can be used to classify the user VM as a high-power VM, thereby predicting power consumption data in a future period of time.

Step S204-6: Determine the power consumption data of the virtual machine according to the first power consumption data and the second power consumption data.

In implementations, in order to implement VM scheduling based on power consumption awareness, power consumption of VMs needs to be determined. As shown in FIG. 3, power consumption of server VMs can be obtained through power consumption models (i.e., correlation models) of the server VMs. The consumption data can include VM1, VM2, VM3, a host service, and a basic power. At the same time, power consumption data of user VMs can be obtained using power consumption models of the user VMs, in combination with historical data and user specifications.

In implementations, obtaining the first power consumption data of the virtual machine through the correlation model at step S204-2, includes:

Step S204-2-2: Obtain a feature vector of the virtual machine and power consumption data of a host computer where the virtual machine is located.

In implementations, the feature vector may be composed of feature dimensions such as CFreq, Util, and Temp.

Step S204-2-4: Input the feature vector of the virtual machine and the power consumption data of the host computer where the virtual machine is located into the correlation model to obtain the first power consumption data.

In implementations, the correlation model can be obtained through a problem of power allocation, and a goal of power allocation is:

$$\min J = \frac{1}{2}(P - \Sigma_{i=1}^{n} p_i)^2,$$

where a determination can be made that power consumption has been allocated when J is close to 0; n represents the number of processes on a NC, i.e., the number of VMs on the NC; P is an actual CPU power consumption that is collected, i.e., power consumption data of the NC, with the number of CPUs not being limited herein, which can be N; $p_i$ is power consumption of each process, i.e., power consumption of each VM, which can be expressed by a linear model, and is specifically: $p_i = WX_i + b$, where W is a parameter factor matrix, b is an offset, W and b can be obtained through learning, so that power consumption data of a VM can be obtained after W and b are obtained; X is a feature vector composed of feature information, as shown in FIG. 5.

Then an objective function of the power allocation becomes:

$$J = \frac{1}{2}(P - \Sigma_{i=1}^{n}(WX_i + b))^2 = \frac{1}{2}(P - W\Sigma_{i=1}^{n}X_i - nb)^2 = \frac{1}{2}(P - WX' - B)^2.$$

As can be seen from above, in order to obtain a power consumption allocation model, it is necessary to construct the model using an accumulated value of all VM feature values under NC and the power consumption of the NC. As such, according to the power consumption allocation model, a VM power consumption model, i.e., a correlation model, can be obtained.

In implementations, when power consumption data of a certain VM needs to be determined, a feature vector X of the VM and power consumption data P of an associated host computer can be obtained, and X and P can be inputted into a correlation model. After X is inputted, W and b can be obtained. After P is inputted, power consumption data of the VM can be obtained using $p_i = WX_i + b$.

In implementations, before obtaining the first power consumption data of the virtual machine through the correlation model at step S204-2, the method may further include the following steps:

Step S204-8: Construct an initial model.

In implementations, the initial model may be a model determined according to a power consumption allocation problem and a correlation matrix.

Step S204-10: Obtain sample data by obtaining historical power consumption data of virtual machines, feature vectors of the virtual machines and historical power consumption data of host computers where the virtual machines are located.

In implementations, sample data of a training model can be composed of historical power consumption data and feature vectors of VMs, and power consumption data of corresponding NCs. The historical power consumption data of VMs can be used as tags for feature vectors of the VMs and the power consumption data of the NCs.

Step S204-12: Train the initial model using the sample data to obtain a correlation model.

In implementations, the initial model is trained through the sample data that is obtained. As can be seen from above, W and b can be calculated, training is completed until W and b satisfy training requirements, thereby obtaining a correlation model. In other words, a process of training the model is a process of solving W and b.

In implementations, after dispatching the virtual machine to the target host computer at step S208, the method may further include the following steps:

Step S216: Obtain historical sales rates of the host computers.

In implementations, the historical sales rate is used to represent a frequency of uses of the host computer by users. The higher the historical sales rate is, the higher the frequency of uses by users is, and the more the need of placing thereof on a rack is. As such, this has a great influence on the shelf density of the rack.

Step S218: Obtain second host computer(s) satisfying a preset condition according to the historical sales rates.

In implementations, since the higher a historical sales rate of a host computer is, the greater the impact on a shelf density of an associated rack is. A host computer having a high sales rate can be selected. Therefore, the preset condition may represent a sales rate threshold for host computers having a relatively high sales rate.

It should be noted that in order to ensure selected NCs to meet requirements, it is necessary to ensure that the number of selected NCs is large enough, for example, more than 1,000.

Step S2020: Obtain a shelf density of a rack based on power consumption data of the second host computer(s), a preset degree of reliability, and rated power consumption data of the rack, wherein the shelf density is used to characterize the number of host computers placed on the same rack.

In implementations, the preset degree of reliability may be obtained according to a ratio between service-specific power capping and abnormal power consumption. For example, if a ratio between service-specific power capping and abnormal power consumption is 5%, a preset degree of reliability may be 95%, i.e., it is credible when the shelf density is 95%.

It should be noted that the foregoing preset degree of reliability may not be a defined value, but may also be a confidence interval.

In implementations, a rack has rated power consumption. To ensure safety, total power consumption of all host computers after being placed on the rack cannot exceed the rated power consumption of the rack. Due to an existence of a preset degree of reliability, NCs can be filtered and selected based on the preset degree of reliability and power consumption data of the NCs, and a shelf density can be obtained based on power consumption data of the selected NCs and the total power consumption of the rack.

Through the above-mentioned solutions, the safety of services can be ensured by specifying a shelf density. A shelf standard can also be given, so that there is no need to reserve a space in advance to prevent the rack from powering down, and the purpose of saving cost can be realized.

In implementations, obtaining the shelf density of the rack based on the power consumption data of the second host computer, the preset degree of reliability and the rated power consumption data of the rack at step S2020, includes:

Step S2020-2: Rank the second host computer(s) according to the power consumption data in an ascending order.

Step S2020-4: Obtain third host computer(s) from the ranked second host computer(s) according to the preset degree of reliability.

It should be noted that, with the influence of confidence levels, NCs with lower power consumption can be selected according to a preset confidence level, in order to ensure the safety of services.

In implementations, ranking can be performed according to an ascending order of power consumption data of NCs, and NCs with higher ranks can be selected according to a preset degree of reliability. For example, the preset degree of reliability is 95%, 1000 NCs are ranked in an ascending order of power consumption (for example, 1 to 1000 w), first 95% of the NCs (for example, 1 to 950 w) are selected, i.e., the top 950 NCs are selected.

Step S2020-6: Obtain maximum power consumption data from power consumption data of the third host computer(s).

Step S2020-8: Obtain a ratio between the rated power consumption data of the rack and the maximum power consumption data to obtain the shelf density.

In implementations, the maximum power consumption of the corresponding NC can be selected for the shelf according to the preset degree of reliability. In other words, after the NCs are selected, a shelf density can be obtained from a ratio between the rated power consumption of the computer rack and the maximum power consumption of the NCs. For example, after top-ranked 950 NCs (for example, 1 to 950 w) are selected, a shelf density can be determined as a rack's rated power consumption 8000 w/950 w=8, i.e., 8 NCs are allowed to be placed on that rack.

In implementations, obtaining the second host computer(s) satisfying the preset condition according to the historical sales rates at step S218, includes:

Step S218-2: Rank the host computer(s) in a descending order of the historical sales rates.

Step S218-4: Obtain the second host computer(s) from the ranked host computer(s) according to a preset sales rate threshold.

In implementations, the preset sales rate threshold may be a minimum sales rate used for filtering and selecting NCs with a relatively high sales rate, which may be 90%, for example.

In implementations, in order to calculate the shelf density, it is necessary to filter and select NCs with a relatively high sales rate. All NCs can be sorted according to a descending order of sales rates, and top-ranked NCs are selected. For example, after the NCs are sorted, the top 90% of NCs can be selected. At the same time, it is necessary to ensure that the number of NCs is sufficient.

It should be noted that the foregoing method embodiments are all expressed as a series of action combinations, for the sake of simple description. However, one skilled in the art should understand that the present disclosure is not limited by the described sequences of actions, because some steps can be performed in other orders or in parallel according to the present disclosure. Furthermore, one skilled in the art should also understand that the embodiments described in the specification are all exemplary embodiments, and actions and modules involved therein may not be necessarily required by the present disclosure.

Through the description of the above embodiments, one skilled in the art can clearly understand that the methods according to the above embodiments can be implemented by means of software plus a necessary general hardware platform, and apparently can also be implemented by hardware. However, in many cases, the former is a better implementation. Based on such understanding, the essences of the technical solutions of the present disclosure or the part that contributes to the existing technologies can be embodied in a form of a software product. Such computer software product is stored in a storage medium (such as ROM/RAM, a magnetic disk, an optical disk), and includes a number of instructions to cause a terminal device (which can be a mobile phone, a computer, a server, or a network device, etc.) to execute the method described in each embodiment of the present disclosure.

According to the embodiments of the present disclosure, a method for scheduling a virtual machine is also provided. It needs to be noted that steps shown in a flowchart of the accompanying drawings can be executed in a computer system such as a set of computer executable instructions. Also, although a logical order is shown in the flowchart, in some cases, the steps may be performed in an order different from the one shown or described herein.

Figure 6:
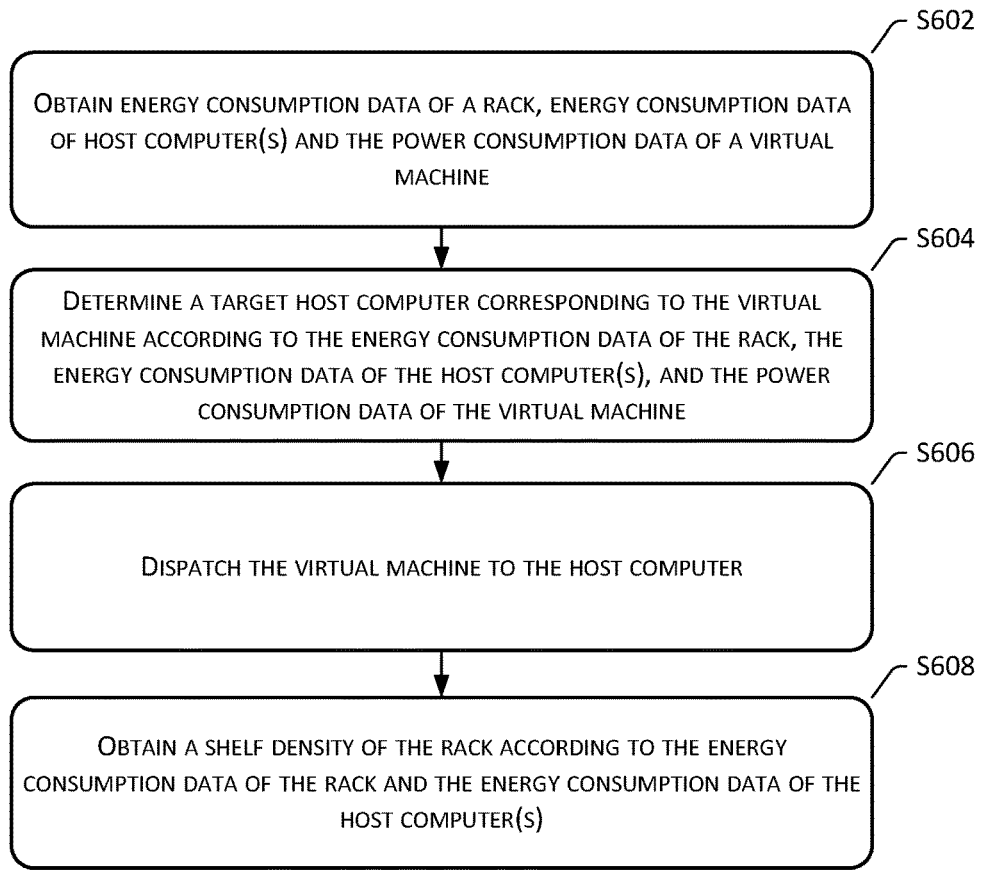
FIG. 6 is a flowchart of a method for scheduling a virtual machine according to the embodiments of the present disclosure.

FIG. 6 is a flowchart of a method for scheduling a virtual machine according to the foregoing embodiments of the present disclosure. As shown in FIG. 6, the method 600 may include the following steps:

Step S602: Obtain energy consumption data of a rack, energy consumption data of host computer(s) and the power consumption data of a virtual machine, where multiple host computers are placed on the rack.

It should be noted that the virtual machine scheduling method provided in the present disclosure is applied to a cloud computing data center.

In implementations, the energy consumption data includes: power consumption data and electric heating data.

In implementations, a host computer (NC) as described above may be a server placed on a rack. The energy consumption data may be real-time power consumption data and electric heating data of the rack(s) or the NC(s). The electric heating data mainly refers to respective temperature(s) of the rack(s) or the NC(s). Both the power consumption data and the electric heating data include an inventory level and an early warning level, wherein the early warning level can be a minimum inventory level that is configured in advance according to actual usage requirements. A virtual machine as described above may be a newly created virtual machine (VM), or a VM that needs to be scheduled or migrated for a second time, which includes a server VM and a user VM. In order to ensure a balanced distribution of power consumption of virtual machines, it is necessary to determine power consumption data of virtual machine(s), i.e., determining power consumption data of a server VM and a user VM. Different VM types have different corresponding power consumption models. For example, a power consumption model corresponding to a server VM may be a correlation model, and a power consumption model corresponding to a user VM may be a user behavior model.

Step S604: Determine a target host computer corresponding to the virtual machine according to the energy consumption data of the rack, the energy consumption data of the host computer(s), and the power consumption data of the virtual machine.

In order to ensure balanced scheduling of power consumption of virtual machines, a scheduling system can perform power-aware scheduling based on power consumption data, inventory level, etc., i.e., combining energy consumption data of racks and NCs, and power consumption data of VMs to perform balanced scheduling of VMs, in order to minimize a variance of power consumptions between racks, to ensure that high-power VMs are preferentially scheduled to NCs with sufficient power consumption. In other words, respective power consumptions of the racks and CPUs of the host computers are made to be as even as possible.

Step S606: Dispatch the virtual machine to the host computer.

In implementations, when a VM needs to be dispatched, the power consumption data and the electric heating data of the rack(s) and the NC(s) placed on the rack(s) can be collected in real time, and the power consumption data and future power consumption data of the VM can be predicted at the same time. According to the power consumption data and the electric heating data of the rack(s) and the NC(s), and the power consumption data and the future power consumption data of the virtual machine, a determination is made that the VM needs to be dispatched to a corresponding rack and a corresponding NC (i.e., determining a NC corresponding to the VM), and the virtual machine is then dispatched to that NC.

For example, as shown in FIG. 3, when a VM is newly created, or a second time of scheduling/migration is made, power consumption data of racks and NCs and electric heating data of an IDC can be collected. Power consumption data of the VM is obtained using power consumption model(s) of server VM(s) and power consumption model(s) of user VM(s). The power consumption data of the racks and the NCs, the electric heating data of the IDC and the power consumption data of the VM is inputted into the scheduling system. Using a scheduling algorithm, scheduling of the VM is performed to select a cluster, a rack and a server.

Step S608: Obtain a shelf density of the rack according to the energy consumption data of the rack and the energy consumption data of the host computer(s), wherein the shelf density is used to represent the number of host computer(s) placed on the same rack.

In implementations, a rack has rated power consumption. To ensure safety, total power consumption of all host computers after being placed on the rack cannot exceed the rated power consumption of the rack. The shelf density of the rack can be obtained based on power consumption data of the NCs and rated power consumption data of the host computers. A standard for shelf density is thereby given. There is no need to reserve a machine space in advance to prevent the rack from powering down and achieve the purpose of saving costs.

The solutions provided in the foregoing embodiments of the present disclosure can obtain energy consumption data of a rack and host computers, determine power consumption data of a virtual machine at the same time, determine a target host computer according to the energy consumption data of the rack and the host computers and the power consumption data of the virtual machine, dispatch the virtual machine to the target host computer, and obtain a shelf density of the rack according to the energy consumption data of the rack and the energy consumption data of the host computers. This thereby realizes scheduling of virtual machines based on real-time power consumption awareness, and realizes the purpose of giving a standard for shelf density.

It is easy to notice that a target host computer corresponding to a virtual machine is determined according to energy consumption data of a rack, energy consumption data of host computers, and power consumption data of the virtual machine. A shelf density of a rack is obtained based on the energy consumption data of the rack and the energy consumption data of the host computers. Compared with the existing technologies, when virtual machine scheduling is performed, not only CPU parameters are considered, but also power consumption of a rack and host computers. An accurate shelf density can be obtained, thereby achieving a balance of scheduling of power consumption of host computers at a granularity of racks in a data center, increase a shelf density, and improve technical effects of resource utilization rates of the cloud computing data center.

Therefore, the above-mentioned solutions of the foregoing embodiments provided by the present disclosure solve the technical problems of unbalanced power consumption scheduling caused by virtual machine scheduling methods that are implemented only according to CPU parameters in the existing technologies.

In implementations, obtaining the shelf density of the rack based on the energy consumption data of the rack and the energy consumption data of the host computers at step S608, includes:

Step S608-2: Obtain historical sales rates of the host computers.

In implementations, the historical sales rate is used to represent a frequency of uses of the host computer by users. The higher the historical sales rate is, the higher the frequency of uses by users is, and the more the need of placing thereof on a rack is. As such, this has a great influence on the shelf density of the rack.

Step S608-4: Obtain second host computer(s) satisfying a preset condition according to the historical sales rates.

In implementations, since the higher a historical sales rate of a host computer is, the greater the impact on a shelf density of an associated rack is. A host computer having a high sales rate can be selected. Therefore, the preset condition may represent a sales rate threshold for host computers having a relatively high sales rate.

It should be noted that in order to ensure selected NCs to meet requirements, it is necessary to ensure that the number of selected NCs is large enough, for example, more than 1,000.

Step S608-6: Obtain a shelf density of a rack based on power consumption data of the second host computer(s), a preset degree of reliability, and rated power consumption data of the rack.

In implementations, the preset degree of reliability may be obtained according to a ratio between service-specific power capping and abnormal power consumption. For example, if a ratio between service-specific power capping and abnormal power consumption is 5%, a preset degree of reliability may be 95%, i.e., it is credible when the shelf density is 95%.

It should be noted that the foregoing preset degree of reliability may not be a defined value, but may also be a confidence interval.

In implementations, due to an existence of a preset degree of reliability, NCs can be filtered and selected based on the preset degree of reliability and power consumption data of the NCs, and a shelf density can be obtained based on power consumption data of the selected NCs and the total power consumption of the rack.

It should be noted that reference may be made to the related description in the foregoing embodiments for exemplary implementations, which are not repeated herein.

Figure 7:
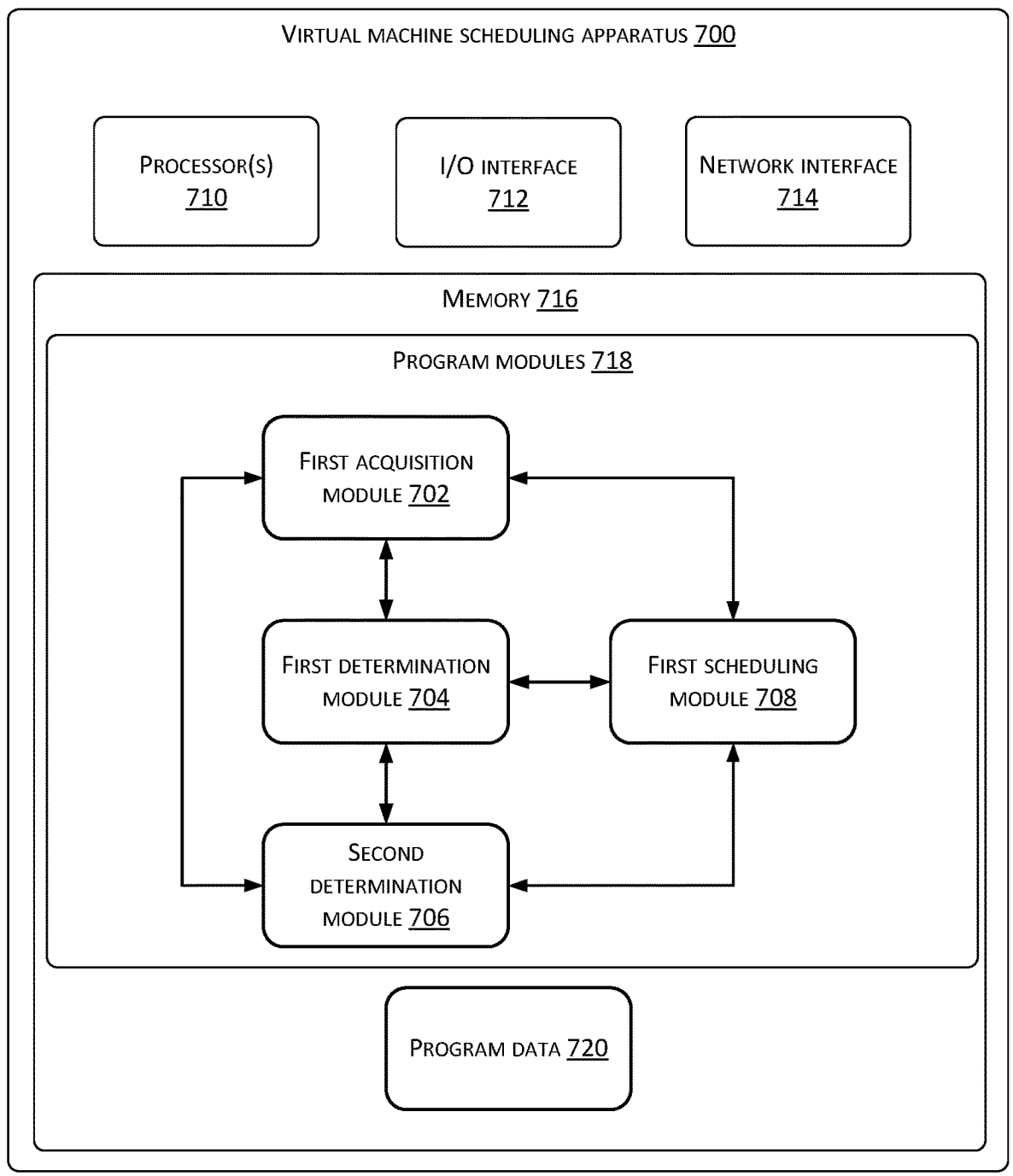
FIG. 7 is a schematic diagram of a virtual machine scheduling apparatus according to the embodiments of the present disclosure.

According to the embodiments of the present disclosure, a virtual machine scheduling apparatus for implementing the above virtual machine scheduling method is also provided. As shown in FIG. 7, an apparatus 700 includes: a first acquisition module 702, a first determination module 704, a second determination module 706 and a first scheduling module 708.

The first acquisition module 702 is configured to obtain energy consumption data of a rack and energy consumption data of host computers, wherein the rack is used to place the host computers. The first determining module 704 is configured to determine power consumption data of a virtual machine. The second determining module 706 is configured to determine a target host computer corresponding to the virtual machine according to the energy consumption data of the rack, the energy consumption data of the host computers, and the power consumption data of the virtual machine. The first scheduling module 708 is configured to dispatch the virtual machine to the target host computer.

In implementations, the apparatus 700 may further include one or more processors 710, an input/output (I/O) interface 712, a network interface 714, and memory 716.

The memory 716 may include a form of computer readable media such as a volatile memory, a random access memory (RAM) and/or a non-volatile memory, for example, a read-only memory (ROM) or a flash RAM. The memory 716 is an example of a computer readable media. In implementations, the memory 716 may include program modules 718 and program data 720.

In implementations, the computer readable media may include a volatile or non-volatile type, a removable or non-removable media, which may achieve storage of information using any method or technology. The information may include a computer-readable instruction, a data structure, a program module or other data. Examples of computer storage media include, but not limited to, phase-change memory (PRAM), static random access memory (SRAM), dynamic random access memory (DRAM), other types of random-access memory (RAM), read-only memory (ROM), electronically erasable programmable read-only memory (EEPROM), quick flash memory or other internal storage technology, compact disk read-only memory (CD-ROM), digital versatile disc (DVD) or other optical storage, magnetic cassette tape, magnetic disk storage or other magnetic storage devices, or any other non-transmission media, which may be used to store information that may be accessed by a computing device. As defined herein, the computer readable media does not include transitory media, such as modulated data signals and carrier waves.

In implementations, the energy consumption data includes: power consumption data and electric heating data.

In implementations, a host computer (NC) as described above may be a server placed on a rack. The energy consumption data may be real-time power consumption data and electric heating data of the rack(s) or the NC(s). The electric heating data mainly refers to respective temperature(s) of the rack(s) or the NC(s). Both the power consumption data and the electric heating data include an inventory level and an early warning level, wherein the early warning level can be a minimum inventory level that is configured in advance according to actual usage requirements. A virtual machine as described above may be a newly created virtual machine (VM), or a VM that needs to be scheduled or migrated for a second time, which includes a server VM and a user VM. In order to ensure a balanced distribution of power consumption of virtual machines, it is necessary to determine power consumption data of virtual machine(s), i.e., determining power consumption data of a server VM and a user VM. Different VM types have different corresponding power consumption models. For example, a power consumption model corresponding to a server VM may be a correlation model, and a power consumption model corresponding to a user VM may be a user behavior model.

It should be noted herein that the first acquisition module 702, the first determination module 704, the second determination module 706, and the first scheduling module 708 correspond to one or more steps of the method 200 in the foregoing embodiments. Examples of implementations and application scenarios of these four modules are the same as those of corresponding steps, but are not limited to the content disclosed in the foregoing embodiments. It should be noted that the described modules can run in the computer terminal 100 provided in the foregoing embodiments as a part of the apparatus.

The solutions provided in the embodiments of the present disclosure can obtain energy consumption data of rack(s) and host computer(s), determine power consumption data of a virtual machine at the same time, determine a target host computer according to the energy consumption data of the rack(s) and the host computer(s) and the power consumption data of the virtual machine, and dispatch the virtual machine to the target host computer, thereby achieving the purpose of dispatching virtual machines based on real-time perception of power consumption.

It is easy to notice that, since a target host computer corresponding to a virtual machine is determined according to energy consumption data of a rack, energy consumption data of host computers, and power consumption data of the virtual machine, not only CPU parameters are considered, but also the power consumption of the rack and the host computers are considered when virtual machine scheduling is performed, as compared with the existing technologies. Balancing of power consumption scheduling of host computers at a granularity of a rack of a data center is achieved, and the technical effects of improving a resource utilization rate of the cloud computing data center are achieved.

Therefore, the solutions provided by the present disclosure solve the technical problems of unbalanced power consumption scheduling caused by virtual machine scheduling methods that are implemented merely according to CPU parameters in the existing technologies.

Figure 8:
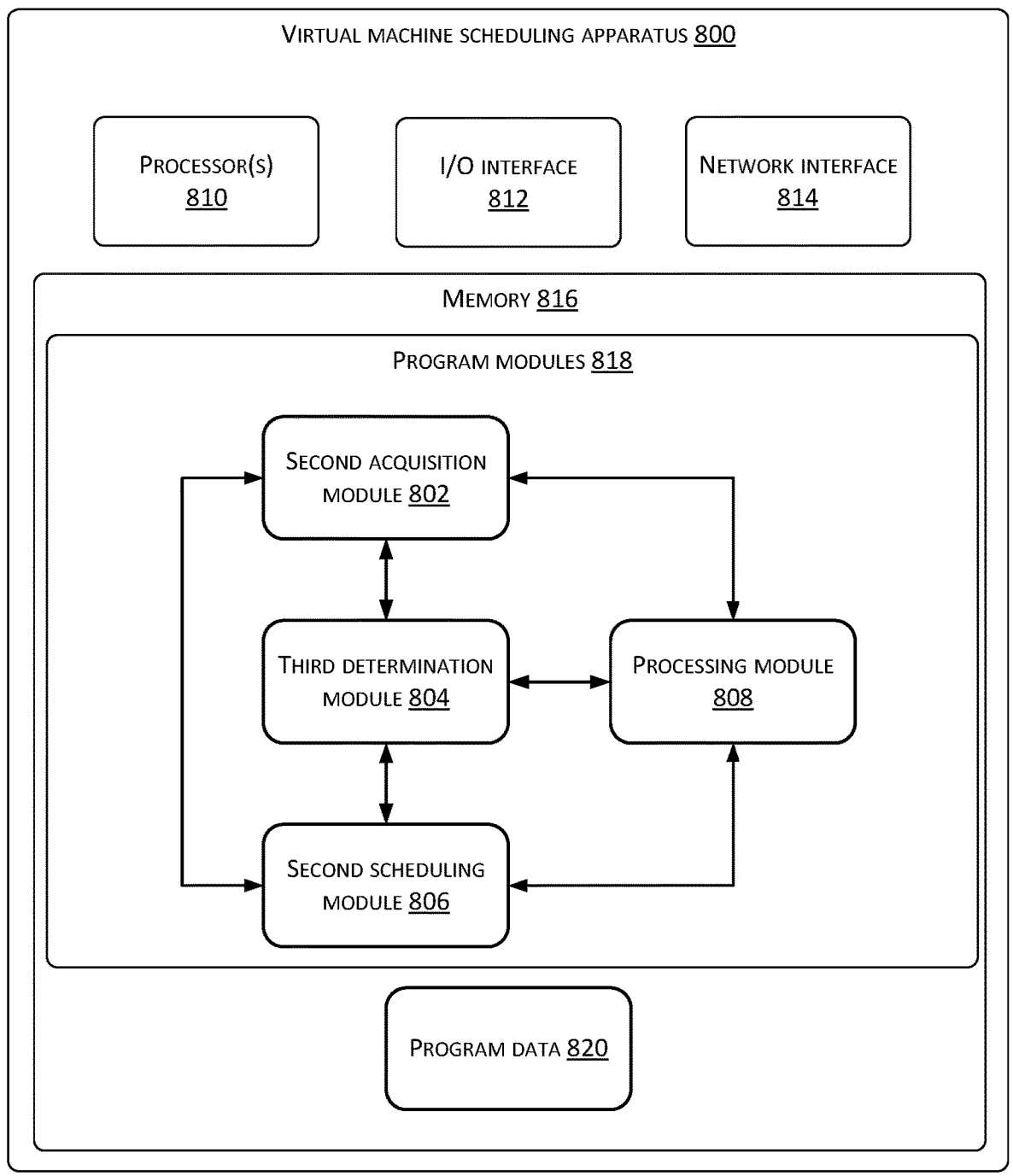
FIG. 8 is a schematic diagram of a virtual machine scheduling apparatus according to the embodiments of the present disclosure.

According to the embodiments of the present disclosure, a virtual machine scheduling apparatus for implementing the above virtual machine scheduling method is also provided. As shown in FIG. 8, an apparatus 800 includes: a second acquisition module 802, a third determination module 804, a second scheduling module 806, and a processing module 808.

The second acquisition module 802 is configured to obtain energy consumption data of a rack, energy consumption data of host computers and power consumption data of a virtual machine, wherein multiple host computers are placed in the rack. The third determination module 804 is configured to determine a target host computer corresponding to the virtual machine based on the energy consumption data of the rack, the energy consumption data of the host computers and the power consumption data of the virtual machine. The second scheduling module 806 is configured to dispatch the virtual machine to the host computer; and obtaining a shelf density of the rack based on the energy consumption data of the rack and the energy consumption data of the host computers, wherein the shelf density is used to characterize a number of host computers placed on the same rack.

In implementations, the apparatus 800 may further include one or more processors 810, an input/output (I/O) interface 812, a network interface 814, and memory 816.

The memory 816 may include a form of computer readable media as described in the foregoing description. In implementations, the memory 816 may include program modules 818 and program data 820.

In implementations, the energy consumption data includes: power consumption data and electric heating data.

In implementations, a host computer (NC) as described above may be a server placed on a rack. The energy consumption data may be real-time power consumption data and electric heating data of the rack(s) or the NC(s). The electric heating data mainly refers to respective temperature(s) of the rack(s) or the NC(s). Both the power consumption data and the electric heating data include an inventory level and an early warning level, wherein the early warning level can be a minimum inventory level that is configured in advance according to actual usage requirements. A virtual machine as described above may be a newly created virtual machine (VM), or a VM that needs to be scheduled or migrated for a second time, which includes a server VM and a user VM. In order to ensure a balanced distribution of power consumption of virtual machines, it is necessary to determine power consumption data of virtual machine(s), i.e., determining power consumption data of a server VM and a user VM. Different VM types have different corresponding power consumption models. For example, a power consumption model corresponding to a server VM may be a correlation model, and a power consumption model corresponding to a user VM may be a user behavior model.

It should be noted here that the second acquisition module 802, the third determination module 804, the second scheduling module 806, and the processing module 808 correspond to one or more steps of the method 600 in the foregoing embodiments. Examples of implementations and application scenarios of these four modules are the same as those of corresponding steps, but are not limited to the content disclosed in the foregoing embodiments. It should be noted that the described modules can run in the computer terminal 100 provided in the foregoing embodiments as a part of the apparatus.

The solutions provided in the foregoing embodiments of the present disclosure can obtain energy consumption data of a rack and host computers, determine power consumption data of a virtual machine at the same time, determine a target host computer according to the energy consumption data of the rack and the host computers and the power consumption data of the virtual machine, dispatch the virtual machine to the target host computer, and obtain a shelf density of the rack according to the energy consumption data of the rack and the energy consumption data of the host computers. This thereby realizes scheduling of virtual machines based on real-time power consumption awareness, and realizes the purpose of giving a standard for shelf density.

It is easy to notice that a target host computer corresponding to a virtual machine is determined according to energy consumption data of a rack, energy consumption data of host computers, and power consumption data of the virtual machine. A shelf density of a rack is obtained based on the energy consumption data of the rack and the energy consumption data of the host computers. Compared with the existing technologies, when virtual machine scheduling is performed, not only CPU parameters are considered, but also power consumption of a rack and host computers. An accurate shelf density can be obtained, thereby achieving a balance of scheduling of power consumption of host computers at a granularity of racks in a data center, increase a shelf density, and improve technical effects of resource utilization rates of the cloud computing data center.

Therefore, the above-mentioned solutions of the foregoing embodiments provided by the present disclosure solve the technical problems of unbalanced power consumption scheduling caused by virtual machine scheduling methods that are implemented only according to CPU parameters in the existing technologies.

According to the embodiments of the present disclosure, a virtual machine scheduling system is also provided, which includes:

a processor; and a memory, coupled to the processor, and configured to provide the processor with instructions for processing the following processing steps: obtaining energy consumption data of a rack and energy consumption data of host computers, wherein the rack is used to place the host computers; determining power consumption data of a virtual machine; determining a target host computer corresponding to the virtual machine according to the energy consumption data of the rack, the energy consumption data of the host computers, and the power consumption data of the virtual machine; and dispatching the virtual machine to the target host computer.

The solutions provided in the foregoing embodiments of the present disclosure can obtain energy consumption data of rack(s) and host computer(s), determine power consumption data of a virtual machine at the same time, determine a target host computer according to the energy consumption data of the rack(s) and the host computer(s) and the power consumption data of the virtual machine, and dispatch the virtual machine to the target host computer, thereby achieving the purpose of dispatching virtual machines based on real-time perception of power consumption.

It is easy to notice that, since a target host computer corresponding to a virtual machine is determined according to energy consumption data of a rack, energy consumption data of host computers, and power consumption data of the virtual machine, not only CPU parameters are considered, but also the power consumption of the rack and the host computers are considered when virtual machine scheduling is performed, as compared with the existing technologies. Balancing of power consumption scheduling of host computers at a granularity of a rack of a data center is achieved, and the technical effects of improving a resource utilization rate of the cloud computing data center are achieved.

Therefore, the solutions of the foregoing embodiments provided by the present disclosure solve the technical problems of unbalanced power consumption scheduling caused by virtual machine scheduling methods that are implemented merely according to CPU parameters in the existing technologies.

The embodiments of the present disclosure may provide a computer terminal. The computer terminal may be any computer terminal device in a computer terminal group. In implementations, the computer terminal may also be replaced with a terminal device such as a mobile terminal.

In implementations, the computer terminal may be located in at least one network device among multiple network devices in a computer network.

In implementations, the computer terminal can execute program codes of the following steps in a virtual machine scheduling method: obtaining energy consumption data of a rack and energy consumption data of host computers, wherein the rack is used to place the host computers; determining power consumption data of a virtual machine; determining a target host computer corresponding to the virtual machine according to the energy consumption data of the rack, the energy consumption data of the host computers, and the power consumption data of the virtual machine; and dispatching the virtual machine to the target host computer.

Figure 9:
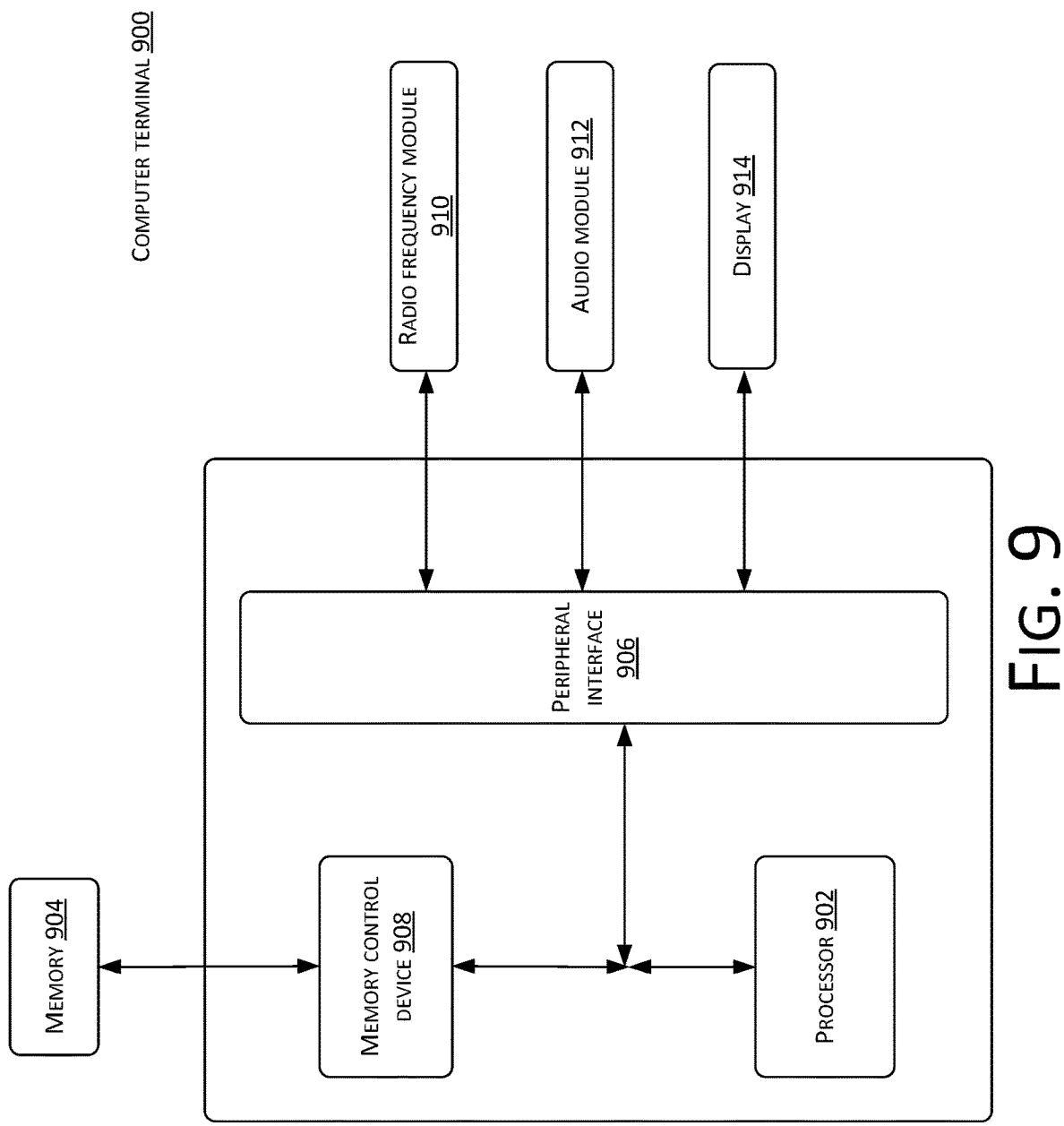
FIG. 9 is a structural block diagram of a computer terminal according to the embodiments of the present disclosure.

In implementations, FIG. 9 is a structural block diagram of a computer terminal 900 according to the embodiments of the present disclosure. As shown in FIG. 9, the computer terminal 900 may include: one or more (only one is shown in the figure) processors 902, memory 904, and a peripheral interface 906. In implementations, the computer terminal 900 may further includes a memory control device 908, a radio frequency module 910, an audio module 912, and/a display 914.

The memory 904 can be configured to store software programs and modules, such as program instructions/modules corresponding to the methods and apparatuses of scheduling virtual machine in the embodiments of the present disclosure. The processor(s) 902 execute(s) various functional applications and data processing by running the software programs and modules stored in the memory 904, i.e., implementing the above-mentioned methods of scheduling virtual machine. The memory 904 may include a high-speed random access memory, and may also include a non-volatile memory, such as one or more magnetic storage devices, flash memory, or other non-volatile solid-state memory. In some examples, the memory 904 may further include storage devices deployed remotely with respect to the processor, and these remote storage devices may be connected to the terminal A through a network. Examples of the network include, but are not limited to, the Internet, a corporate intranet, a local area network, a mobile communication network, and a combination thereof.

The processor(s) 902 may call information and application programs stored in the memory through a transmission device to perform the following steps: obtaining energy consumption data of rack(s) and energy consumption data of host computers, wherein the rack(s) is/are used to place the host computers; determining power consumption data of a virtual machine; determining a target host computer corresponding to the virtual machine according to the energy consumption data of the rack(s), the energy consumption data of the host computers, and the power consumption data of the virtual machine; and dispatching the virtual machine to the target host computer.

In implementations, the processor(s) may also execute program codes of the following steps: the energy consumption data including power consumption data and electric heating data.

In implementations, the processor(s) may also execute program codes of the following steps: determining first rack(s) having normal energy consumption according to the energy consumption data of the rack(s); determining first host computer(s) with a normal energy consumption according to energy consumption data of host computer(s) placed on the first rack(s); and determining a target host computer according to the energy consumption data of the first host computer(s) and power consumption data of a virtual machine.

In implementations, the processor(s) may also execute program codes of the following steps: determining weight value(s) of the first host computer(s) according to the power consumption data of the first host computer(s), wherein the power consumption data is inversely proportional to the weight value(s); and obtaining the target host computer according to the weight value(s) of the first host computer(s) and the power consumption data of the virtual machine.

In implementations, the processor(s) may also execute program codes of the following steps: the first rack(s) being rack(s) whose power consumption data does not exceed a first threshold and whose electric heating data does not exceed a second threshold; and the first host computer(s) being placed on the first rack(s), and having power consumption data that does not exceed a third threshold, electric heating data that does not exceed a fourth threshold, and a hardware detection result indicating a host computer to have no abnormality.

In implementations, the processor(s) may also execute program codes of the following steps: before determining the target host computer corresponding to the virtual machine according to the energy consumption data of the rack(s), the energy consumption data of the host computer(s), and the power consumption data of the virtual machine, determining whether the virtual machine is a preset virtual machine, wherein the preset virtual machine is a virtual machine that cannot be scheduled; determining the target host computer corresponding to the virtual machine according to the energy consumption data of the rack(s), the energy consumption data of the host computer(s), and the power consumption data of the virtual machine if the virtual machine is not a preset virtual machine; and performing, if the virtual machine is a preset virtual machine, power-limiting processing on the preset virtual machine according to the power consumption data of the rack(s) and the host computer(s), and the power consumption data of the virtual machine.

In implementations, the processor(s) may also execute program codes of the following steps: obtaining first power consumption data of the virtual machine through a correlation model, wherein the correlation model is used to characterize a correlation between feature parameters of the virtual machine; obtaining second power consumption data of the virtual machine according to historical power consumption data and feature data of the virtual machine; and determining the power consumption data of the virtual machine according to the first power consumption data and the second power consumption data.

In implementations, the processor(s) may also execute program codes of the following steps: obtaining a feature vector of the virtual machine and power consumption data of a host computer where the virtual machine is located; and inputting the feature vector of the virtual machine and the power consumption data of the host computer where the virtual machine is located into the correlation model to obtain the first power consumption data.

In implementations, the processor(s) may also execute program codes of the following steps: before obtaining the first power consumption data of the virtual machine through the correlation model, constructing an initial model; obtaining sample data by obtaining historical power consumption data of virtual machines, feature vectors of the virtual machines and historical power consumption data of host computers where the virtual machines are located; and training the initial model using the sample data to obtain a correlation model.

In implementations, the processor(s) may also execute program codes of the following steps: after dispatching the virtual machine to the target host computer, obtaining historical sales rates of the host computers; obtaining second host computer(s) satisfying a preset condition according to the historical sales rates; and obtaining a shelf density of a rack based on power consumption data of the second host computer(s), a preset degree of reliability, and rated power consumption data of the rack, wherein the shelf density is used to characterize the number of host computers placed on the same rack.

In implementations, the processor(s) may also execute program codes of the following steps: ranking the second host computer(s) according to the power consumption data in an ascending order; obtaining third host computer(s) from the ranked second host computer(s) according to the preset degree of reliability; obtaining maximum power consumption data from power consumption data of the third host computer(s); and obtaining a ratio between the rated power consumption data of the rack and the maximum power consumption data to obtain the shelf density.

In implementations, the processor(s) may also execute program codes of the following steps: ranking the host computer(s) in a descending order of the historical sales rates; and obtaining the second host computer(s) from the ranked host computer(s) according to a preset sales rate threshold.

Using the embodiments of the application, energy consumption data of rack(s) and host computers can be obtained, and power consumption data of a virtual machine can be determined at the same time. A target host can be determined based on the energy consumption data of the rack(s) and the host computers and the power consumption data of the virtual machine, and the virtual machine can be dispatched to the target host computer, so as to achieve the purpose of dispatching virtual machines based on real-time perception of power consumption.

It is easy to notice that, since a target host computer corresponding to a virtual machine is determined according to energy consumption data of a rack, energy consumption data of host computers, and power consumption data of the virtual machine, not only CPU parameters are considered, but also the power consumption of the rack and the host computers are considered when virtual machine scheduling is performed, as compared with the existing technologies. Balancing of power consumption scheduling of host computers at a granularity of a rack of a data center is achieved, and the technical effects of improving a resource utilization rate of the cloud computing data center are achieved.

Therefore, the solutions provided by the present disclosure solve the technical problems of unbalanced power consumption scheduling caused by virtual machine scheduling methods that are implemented merely according to CPU parameters in the existing technologies.

One of ordinary skill in the art can understand that the structure shown in FIG. 9 is only used for illustration, and the computer terminal can also be a smart phone (such as an Android phone, an iOS phone, etc.), a tablet computer, a handheld computer, and a mobile Internet device (Mobile Internet Devices, MID), a PAD, and other terminal devices. FIG. 8 does not limit the structure of the above electronic device. For example, the computer terminal may also include more or fewer components (such as a network interface, a display device, etc.) than those shown in FIG. 8, or have a configuration different from that shown in FIG. 9.

One of ordinary skill in the art can understand that all or part of the steps in various methods of the foregoing embodiments can be completed by instructing relevant hardware of a terminal device through a program. The program can be stored in a computer-readable storage medium, which may include a flash disk, read-only memory (Read-Only Memory, ROM), random access memory (Random Access Memory, RAM), a magnetic disk, or an optical disk, etc.

The embodiments of the present disclosure also provide a storage medium. In implementations, the storage medium may be configured to store program codes executed by the virtual machine scheduling method provided in the foregoing embodiments.

In implementations, the storage medium may be located in any computer terminal in a computer terminal group in a computer network, or located in any mobile terminal in a mobile terminal group.

In implementations, the storage medium is configured to store program codes for performing the following steps: obtaining energy consumption data of rack(s) and energy consumption data of host computers, wherein the rack(s) is/are used to place the host computers; determining power consumption data of a virtual machine; determining a target host computer corresponding to the virtual machine according to the energy consumption data of the rack(s), the energy consumption data of the host computers, and the power consumption data of the virtual machine; and dispatching the virtual machine to the target host computer.

In implementations, the storage medium is further configured to store program codes for executing the following steps: the energy consumption data including power consumption data and electric heating data.

In implementations, the storage medium is further configured to store program codes for executing the following steps: determining first rack(s) having normal energy consumption according to the energy consumption data of the rack(s); determining first host computer(s) with a normal energy consumption according to energy consumption data of host computer(s) placed on the first rack(s); and determining a target host computer according to the energy consumption data of the first host computer(s) and power consumption data of a virtual machine.

In implementations, the storage medium is further configured to store program codes for executing the following steps: determining weight value(s) of the first host computer(s) according to the power consumption data of the first host computer(s), wherein the power consumption data is inversely proportional to the weight value(s); and obtaining the target host computer according to the weight value(s) of the first host computer(s) and the power consumption data of the virtual machine.

In implementations, the storage medium is further configured to store program codes for executing the following steps: the first rack(s) being rack(s) whose power consumption data does not exceed a first threshold and whose electric heating data does not exceed a second threshold; and the first host computer(s) being placed on the first rack(s), and having power consumption data that does not exceed a third threshold, electric heating data that does not exceed a fourth threshold, and a hardware detection result indicating a host computer to have no abnormality.

In implementations, the storage medium is further configured to store program codes for executing the following steps: before determining the target host computer corresponding to the virtual machine according to the energy consumption data of the rack(s), the energy consumption data of the host computer(s), and the power consumption data of the virtual machine, determining whether the virtual machine is a preset virtual machine, wherein the preset virtual machine is a virtual machine that cannot be scheduled; determining the target host computer corresponding to the virtual machine according to the energy consumption data of the rack(s), the energy consumption data of the host computer(s), and the power consumption data of the virtual machine if the virtual machine is not a preset virtual machine; and performing, if the virtual machine is a preset virtual machine, power-limiting processing on the preset virtual machine according to the power consumption data of the rack(s) and the host computer(s), and the power consumption data of the virtual machine.

In implementations, the storage medium is further configured to store program codes for executing the following steps: obtaining first power consumption data of the virtual machine through a correlation model, wherein the correlation model is used to characterize a correlation between feature parameters of the virtual machine; obtaining second power consumption data of the virtual machine according to historical power consumption data and feature data of the virtual machine; and determining the power consumption data of the virtual machine according to the first power consumption data and the second power consumption data.

In implementations, the storage medium is further configured to store program codes for executing the following steps: obtaining a feature vector of the virtual machine and power consumption data of a host computer where the virtual machine is located; and inputting the feature vector of the virtual machine and the power consumption data of the host computer where the virtual machine is located into the correlation model to obtain the first power consumption data.

In implementations, the storage medium is further configured to store program codes for executing the following steps: before obtaining the first power consumption data of the virtual machine through the correlation model, constructing an initial model; obtaining sample data by obtaining historical power consumption data of virtual machines, feature vectors of the virtual machines and historical power consumption data of host computers where the virtual machines are located; and training the initial model using the sample data to obtain a correlation model.

In implementations, the storage medium is further configured to store program codes for executing the following steps: after dispatching the virtual machine to the target host computer, obtaining historical sales rates of the host computers; obtaining second host computer(s) satisfying a preset condition according to the historical sales rates; and obtaining a shelf density of a rack based on power consumption data of the second host computer(s), a preset degree of reliability, and rated power consumption data of the rack, wherein the shelf density is used to characterize the number of host computers placed on the same rack.

In implementations, the storage medium is further configured to store program codes for executing the following steps: ranking the second host computer(s) according to the power consumption data in an ascending order; obtaining third host computer(s) from the ranked second host computer(s) according to the preset degree of reliability; obtaining maximum power consumption data from power consumption data of the third host computer(s); and obtaining a ratio between the rated power consumption data of the rack and the maximum power consumption data to obtain the shelf density.

In implementations, the storage medium is further configured to store program codes for executing the following steps: ranking the host computer(s) in a descending order of the historical sales rates; and obtaining the second host computer(s) from the ranked host computer(s) according to a preset sales rate threshold.

Sequence numbers of the foregoing embodiments of the present disclosure are only used for description, and do not represent qualities of the embodiments.

In the foregoing embodiments of the present disclosure, the description of each embodiment has its own focus. For parts that are not described in detail in one embodiment, reference may be made to related descriptions of other embodiments.

In a number of embodiments provided in the present disclosure, it should be understood that the disclosed technical content can be implemented in other ways. The apparatus embodiments described above are only illustrative. For example, a division of units is only a division of logical functions. In practical implementations, other methods of division may exist. For example, multiple units or components may be combined or may be integrated into another system. Alternatively, some features can be ignored or not implemented. In addition, mutual coupling or direct coupling or communication connection that is displayed or discussed may be indirect coupling or communication connection through some interfaces, units or modules, and may be in electrical or other forms.

The units described as separate components may or may not be physically separated. The components displayed as units may or may not be physical units, i.e., may be located in one place, or may be distributed over multiple network units. Some or all of the units may be selected according to actual needs to achieve the objectives of the solutions of the embodiments.

In addition, functional units in various embodiments of the present disclosure may be integrated into a single processing unit. Alternatively, each unit may exist alone physically. Alternatively, two or more units may be integrated into one unit. The above-mentioned integrated unit can be realized in a form of hardware or software functional unit.

If being implemented in a form of a software functional unit and sold or used as an independent product, the integrated unit can be stored in a computer readable storage medium. Based on such understanding, the essence of the technical solutions of the present disclosure, or the part that contributes to the existing technologies, or all or part of the technical solutions can be embodied in a form of a software product. Such computer software product is stored in a storage medium, and includes a number of instructions to cause a computing device (which may be a personal computer, a server, or a network device, etc.) to execute all or part of the steps of the method in each embodiment of the present disclosure. The storage media include various types of media that are capable of storing program codes, such as a flash disk, read-only memory (ROM, Read-Only Memory), random access memory (RAM, Random Access Memory), a mobile hard disk, a magnetic disk, or an optical disk, etc.

The above represents only exemplary embodiments of the present disclosure. It should be pointed out that one of ordinary skill in the art can make a number of improvements and modifications without departing from the principles of the present disclosure. These improvements and modifications shall also be regarded to fall into the scope of protection of the present disclosure.

The present disclosure can further be understood using the following clauses.

Clause 1: A method for scheduling a virtual machine, comprising: obtaining energy consumption data of rack(s) and energy consumption data of host computers, wherein the rack(s) is/are used to place the host computers; determining power consumption data of a virtual machine; determining a target host computer corresponding to the virtual machine according to the energy consumption data of the rack(s), the energy consumption data of the host computers, and the power consumption data of the virtual machine; and dispatching the virtual machine to the target host computer.

Clause 2: The method of Clause 1, wherein the energy consumption data comprises power consumption data and electric heating data.

Clause 3: The method of Clause 2, wherein determining the target host computer corresponding to the virtual machine according to the energy consumption data of the rack, the energy consumption data of the host computers, and the power consumption data of the virtual machine comprises: determining first rack(s) having normal energy consumption according to the energy consumption data of the rack(s); determining first host computer(s) with a normal energy consumption according to energy consumption data of host computer(s) placed on the first rack(s); and determining the target host computer according to the energy consumption data of the first host computer(s) and power consumption data of the virtual machine.

Clause 4: The method of Clause 3, wherein determining the target host computer according to the energy consumption data of the first host computer(s) and power consumption data of the virtual machine comprises: determining weight value(s) of the first host computer(s) according to the power consumption data of the first host computer(s), wherein the power consumption data is inversely proportional to the weight value(s); and obtaining the target host computer according to the weight value(s) of the first host computer(s) and the power consumption data of the virtual machine.

Clause 5: The method of Clause 3, wherein the first rack(s) is/are rack(s) whose power consumption data does not exceed a first threshold and whose electric heating data does not exceed a second threshold; and the first host computer(s) is/are placed on the first rack(s), and having power consumption data that does not exceed a third threshold, electric heating data that does not exceed a fourth threshold, and a hardware detection result indicating a host computer to have no abnormality.

Clause 6: The method of Clause 2, wherein: before determining the target host computer corresponding to the virtual machine according to the energy consumption data of the rack(s), the energy consumption data of the host computer(s), and the power consumption data of the virtual machine, the method further comprises: determining whether the virtual machine is a preset virtual machine, wherein the preset virtual machine is a virtual machine that cannot be scheduled; determining the target host computer corresponding to the virtual machine according to the energy consumption data of the rack(s), the energy consumption data of the host computer(s), and the power consumption data of the virtual machine if the virtual machine is not a preset virtual machine; and performing, if the virtual machine is a preset virtual machine, power-limiting processing on the preset virtual machine according to the power consumption data of the rack(s) and the host computer(s), and the power consumption data of the virtual machine.

Clause 7: The method of Clause 2, wherein determining the power consumption data of the virtual machine comprises: obtaining first power consumption data of the virtual machine through a correlation model, wherein the correlation model is used to characterize a correlation between feature parameters of the virtual machine; obtaining second power consumption data of the virtual machine according to historical power consumption data and feature data of the virtual machine; and determining the power consumption data of the virtual machine according to the first power consumption data and the second power consumption data.

Clause 8: The method of Clause 7, wherein obtaining the first power consumption data of the virtual machine through the correlation model comprises: obtaining a feature vector of the virtual machine and power consumption data of a host computer where the virtual machine is located; and inputting the feature vector of the virtual machine and the power consumption data of the host computer where the virtual machine is located into the correlation model to obtain the first power consumption data.

Clause 9: The method of Clause 7, wherein: before obtaining the first power consumption data of the virtual machine through the correlation model, the method further comprises: constructing an initial model; obtaining sample data by obtaining historical power consumption data of virtual machines, feature vectors of the virtual machines and historical power consumption data of host computers where the virtual machines are located; and training the initial model using the sample data to obtain a correlation model.

Clause 10: The method of Clause 2, wherein: after dispatching the virtual machine to the target host computer, the method further comprises: obtaining historical sales rates of the host computers; obtaining second host computer(s) satisfying a preset condition according to the historical sales rates; and obtaining a shelf density of a rack based on power consumption data of the second host computer(s), a preset degree of reliability, and rated power consumption data of the rack, wherein the shelf density is used to characterize the number of host computers placed on the same rack.

Clause 11: The method of Clause 10, wherein obtaining the shelf density of the rack based on the power consumption data of the second host computer(s), the preset degree of reliability, and the rated power consumption data of the rack, the method further comprises: ranking the second host computer(s) according to the power consumption data in an ascending order; obtaining third host computer(s) from the ranked second host computer(s) according to the preset degree of reliability; obtaining maximum power consumption data from power consumption data of the third host computer(s); and obtaining a ratio between the rated power consumption data of the rack and the maximum power consumption data to obtain the shelf density.

Clause 12: The method of Clause 10, wherein obtaining the second host computer(s) satisfying the preset condition according to the historical sales rates comprises: ranking the host computer(s) in a descending order of the historical sales rates; and obtaining the second host computer(s) from the ranked host computer(s) according to a preset sales rate threshold.

Clause 13: A method for scheduling a virtual machine, comprising: obtaining energy consumption data of a rack, energy consumption data of host computers and power consumption data of a virtual machine, wherein multiple host computers are placed in the rack; determining a target host computer corresponding to the virtual machine based on the energy consumption data of the rack, the energy consumption data of the host computers and the power consumption data of the virtual machine; dispatching the virtual machine to the host computer; and obtaining a shelf density of the rack based on the energy consumption data of the rack and the energy consumption data of the host computers, wherein the shelf density is used to characterize a number of host computers placed on the same rack.

Clause 14: The method of Clause 13, wherein obtaining the shelf density of the rack based on the energy consumption data of the rack and the energy consumption data of the host computers obtaining historical sales rates of the host computers comprises: obtaining second host computer(s) satisfying a preset condition according to the historical sales rates; and obtaining the shelf density of the rack based on power consumption data of the second host computer(s), a preset degree of reliability, and rated power consumption data of the rack.

Clause 15: A storage medium comprising: a stored program, wherein the program, when running, controls a device where the storage medium is located to perform the following steps: obtaining energy consumption data of a rack and energy consumption data of host computers, wherein the rack is used to place the host computers; determining power consumption data of a virtual machine; determining a target host computer corresponding to the virtual machine according to the energy consumption data of the rack, the energy consumption data of the host computers, and the power consumption data of the virtual machine; and dispatching the virtual machine to the target host computer.

Clause 16: A processor configured to run a program, wherein the program executes the following steps when running: obtaining energy consumption data of a rack and energy consumption data of host computers, wherein the rack is used to place the host computers; determining power consumption data of a virtual machine; determining a target host computer corresponding to the virtual machine according to the energy consumption data of the rack, the energy consumption data of the host computers, and the power consumption data of the virtual machine; and dispatching the virtual machine to the target host computer.

Clause 17: A virtual machine scheduling system comprising: a processor; and a memory, coupled to the processor, and configured to provide the processor with instructions for processing the following processing steps: obtaining energy consumption data of a rack and energy consumption data of host computers, wherein the rack is used to place the host computers; determining power consumption data of a virtual machine; determining a target host computer corresponding to the virtual machine according to the energy consumption data of the rack, the energy consumption data of the host computers, and the power consumption data of the virtual machine; and dispatching the virtual machine to the target host computer.

What is claimed is:

1. A method implemented by one or more computing devices, the method comprising:
    obtaining energy consumption data of one or more racks and energy consumption data of a plurality of host computers, wherein the one or more racks are used to place the plurality of host computers;
    determining power consumption data of a virtual machine;
    determining a target host computer corresponding to the virtual machine according to the energy consumption data of the one or more racks, the energy consumption data of the plurality of host computers, and the power consumption data of the virtual machine; and
    dispatching the virtual machine to the target host computer;
    obtaining historical sales rates of the plurality of host computers;
    obtaining one or more second host computers satisfying a preset condition according to the historical sales rates; and
    obtaining a shelf density of a rack based on power consumption data of the one or more second host computers, a preset degree of reliability, and rated power consumption data of the rack, wherein the shelf density is used to characterize a number of host computers placed on a same rack.

2. The method of claim 1, wherein energy consumption data of one of the plurality of host computers comprises power consumption data and electric heating data of the one of the plurality of host computers.

3. The method of claim 1, wherein determining the target host computer corresponding to the virtual machine according to the energy consumption data of the rack, the energy consumption data of the plurality of host computers, and the power consumption data of the virtual machine comprises:
    determining at least one first rack having a first energy consumption according to the energy consumption data of the one or more racks;
    determining one or more first host computers with a second energy consumption according to energy consumption data of corresponding host computers placed on the at least one first rack; and
    determining the target host computer according to the energy consumption data of the one or more first host computers and the power consumption data of the virtual machine.

4. The method of claim 3, wherein determining the target host computer according to the energy consumption data of the one or more first host computers and the power consumption data of the virtual machine comprises:
    determining one or more weight values of the one or more first host computers according to power consumption data of the one or more first host computers, wherein the power consumption data of the one or more first host computers is inversely proportional to the one or more weight values; and
    obtaining the target host computer according to the one or more weight values of the one or more first host computers and the power consumption data of the virtual machine.

5. The method of claim 3, wherein the at least one first rack is a rack whose power consumption data does not exceed a first threshold and whose electric heating data does not exceed a second threshold; and the one or more first host computers are placed on the at least one first rack and having power consumption data that does not exceed a third threshold, electric heating data that does not exceed a fourth threshold, and a hardware detection result indicating a host computer to have no abnormality.

6. The method of claim 2, wherein: before determining the target host computer corresponding to the virtual machine according to the energy consumption data of the one or more racks, the energy consumption data of the plurality of host computers, and the power consumption data of the virtual machine, the method further comprises:
    determining whether the virtual machine is a preset virtual machine, wherein the preset virtual machine is a virtual machine that is not schedulable;
    determining the target host computer corresponding to the virtual machine according to the energy consumption data of the one or more racks, the energy consumption data of the plurality of host computers, and the power consumption data of the virtual machine if the virtual machine is not the preset virtual machine; and
    performing, if the virtual machine is the preset virtual machine, power-limiting processing on the preset virtual machine according to power consumption data of the one or more racks and the plurality of host computers, and the power consumption data of the virtual machine.

7. The method of claim 1, wherein determining the power consumption data of the virtual machine comprises:
    obtaining first power consumption data of the virtual machine through a correlation model, wherein the correlation model is used to characterize a correlation between feature parameters of the virtual machine;
    obtaining second power consumption data of the virtual machine according to historical power consumption data and feature data of the virtual machine; and
    determining the power consumption data of the virtual machine according to the first power consumption data and the second power consumption data.

8. The method of claim 7, wherein obtaining the first power consumption data of the virtual machine through the correlation model comprises:

obtaining a feature vector of the virtual machine and power consumption data of a host computer where the virtual machine is located; and inputting the feature vector of the virtual machine and the power consumption data of the host computer where the virtual machine is located into the correlation model to obtain the first power consumption data.

9. The method of claim 7, wherein: before obtaining the first power consumption data of the virtual machine through the correlation model, the method further comprises:

constructing an initial model;

obtaining sample data by obtaining historical power consumption data of virtual machines, feature vectors of the virtual machines and historical power consumption data of host computers where the virtual machines are located; and training the initial model using the sample data to obtain the correlation model.

10. The method of claim 1, wherein obtaining the shelf density of the rack based on the power consumption data of the one or more second host computers, the preset degree of reliability, and the rated power consumption data of the rack, comprises:

ranking the one or more second host computers according to the power consumption data of the one or more second host computers in an ascending order;

obtaining one or more third host computers from the one or more ranked second host computers according to the preset degree of reliability;

obtaining maximum power consumption data from power consumption data of the one or more third host computers; and obtaining a ratio between the rated power consumption data of the rack and the maximum power consumption data to obtain the shelf density.

11. The method of claim 1, wherein obtaining the one or more second host computers satisfying the preset condition according to the historical sales rates comprises:

ranking the plurality of host computers in a descending order of the historical sales rates; and obtaining the one or more second host computers from the plurality of ranked host computers according to a preset sales rate threshold.

12. A system comprising:

one or more processors; and memory storing executable instructions that, when executed by the one or more processors, cause the one or more processors to perform acts comprising:

obtaining energy consumption data of a rack, energy consumption data of multiple host computers and power consumption data of a virtual machine, wherein multiple host computers are placed in the rack;

determining a target host computer corresponding to the virtual machine based on the energy consumption data of the rack, the energy consumption data of the multiple host computers and the power consumption data of the virtual machine;

dispatching the virtual machine to the target host computer; and obtaining a shelf density of the rack based on the energy consumption data of the rack and the energy consumption data of the multiple host computers, wherein the shelf density is used to characterize a number of host computers placed on a same rack, and wherein obtaining the shelf density of the rack based on the energy consumption data of the rack and the energy consumption data of the host computers comprises:

obtaining historical sales rates of the multiple host computers;

obtaining one or more second host computers satisfying a preset condition according to the historical sales rates; and obtaining the shelf density of the rack based on power consumption data of the one or more second host computers, a preset degree of reliability, and rated power consumption data of the rack.

13. One or more computer readable media storing executable instructions that, when executed by the one or more processors, cause one or more processors to perform acts comprising:

obtaining energy consumption data of one or more racks and energy consumption data of a plurality of host computers, wherein the one or more racks are used to place the plurality of host computers;

determining power consumption data of a virtual machine;

determining a target host computer corresponding to the virtual machine according to the energy consumption data of the one or more racks, the energy consumption data of the plurality of host computers, and the power consumption data of the virtual machine, wherein determining the target host computer corresponding to the virtual machine comprises:

determining one or more weight values of one or more first host computers according to power consumption data of the one or more first host computers, wherein the power consumption data of the one or more first host computers is inversely proportional to the one or more weight values; and obtaining the target host computer according to the one or more weight values of the one or more first host computers and the power consumption data of the virtual machine; and dispatching the virtual machine to the target host computer.

14. The one of or more computer readable media claim 13, wherein energy consumption data of one of the plurality of host computers comprises power consumption data and electric heating data of the one of the plurality of host computers.

15. The one of or more computer readable media claim 13, wherein determining the target host computer corresponding to the virtual machine according to the energy consumption data of the rack, the energy consumption data of the plurality of host computers, and the power consumption data of the virtual machine further comprises:

determining at least one first rack having a first energy consumption according to the energy consumption data of the one or more racks;

determining the one or more first host computers according to energy consumption data of corresponding host computers placed on the at least one first rack, the one or more first host computers having a second energy consumption; and determining the target host computer according to the energy consumption data of the one or more first host computers and power consumption data of the virtual machine.

16. The one of or more computer readable media claim 15, wherein the at least one first rack is a rack whose power consumption data does not exceed a first threshold and whose electric heating data does not exceed a second threshold; and the one or more first host computers are placed on the at least one first rack and having power consumption data that does not exceed a third threshold, electric heating data that does not exceed a fourth threshold, and a hardware detection result indicating a host computer to have no abnormality.

17. The one of or more computer readable media claim 15, wherein: before determining the target host computer corresponding to the virtual machine according to the energy consumption data of the one or more racks, the energy consumption data of the plurality of host computers, and the power consumption data of the virtual machine, the method further comprises:

determining whether the virtual machine is a preset virtual machine, wherein the preset virtual machine is a virtual machine that is not schedulable;

determining the target host computer corresponding to the virtual machine according to the energy consumption data of the one or more racks, the energy consumption data of the plurality of host computers, and the power consumption data of the virtual machine if the virtual machine is not the preset virtual machine; and performing, if the virtual machine is the preset virtual machine, power-limiting processing on the preset virtual machine according to the power consumption data of the one or more racks and the plurality of host computers, and the power consumption data of the virtual machine.

\* \* \* \* \*